United States Patent [19]

Kimura

[11] Patent Number: 5,029,321
[45] Date of Patent: Jul. 2, 1991

[54] SOLID STATE IMAGE SENSING DEVICE FORMED OF CHARGE COUPLED DEVICES

[75] Inventor: Mikihiro Kimura, Hyogo, Japan

[73] Assignee: Mitsubishi Denki Kabushiki Kaisha, Tokyo, Japan

[21] Appl. No.: 446,261

[22] Filed: Dec. 5, 1989

[30] Foreign Application Priority Data

Dec. 19, 1988 [JP] Japan ................................ 63-321564

[51] Int. Cl.$^5$ ............................................ H01L 29/78
[52] U.S. Cl. ....................................... 357/24; 357/30; 357/55
[58] Field of Search .................... 357/41, 23.4, 24, 22, 357/43, 23, 23.6, 55, 59, 30, 55

[56] References Cited

U.S. PATENT DOCUMENTS

| | | | |
|---|---|---|---|
| 4,234,887 | 11/1980 | Vanderslice | 357/24 |
| 4,672,410 | 6/1987 | Miura et al. | 357/41 |
| 4,760,273 | 7/1988 | Kimata | 357/24 |
| 4,837,606 | 6/1989 | Goodman et al. | 357/23.4 |
| 4,878,102 | 10/1989 | Bakker et al. | 357/24 |

FOREIGN PATENT DOCUMENTS 51254 5/1987 Japan .
290175 5/1987 Japan .

OTHER PUBLICATIONS

L. G. Heller, IBM Technical Disclosure Bulletin vol. 22, No. 11, 4/1980.
Walden et al. "The Buried Channel Charge Coupled Device", pp. 1635-1640, Bell System Technical Journal, Apr. 1990.
Boyle et al. "Charge Coupled Semiconductor Devices", pp. 587-593, Bell System Technical Journal, Apr. 1990.

Primary Examiner—Gene M. Munson
Attorney, Agent, or Firm—Lowe, Price, LeBlanc and Becker

[57] ABSTRACT

A solid state image sensing device comprises photoelectric converting portions (8) and charge coupled portions. A plurality of parallel trenches (2) are formed on a main surface of a semiconductor substrate (1). Photoelectric converting portions are on the surfaces of the semiconductor substrate on both sides of each of the trenches. Charge transfer portions corresponding to the photoelectric converting portions are independently formed on the side surfaces of the trenches. Insulating and isolating regions (15, 29, 30) are formed on the bottom portions of the trenches. By providing two independent charge transfer portions in one trench, the area occupied by the charge transfer portions can be reduced.

18 Claims, 17 Drawing Sheets

SOLID STATE IMAGE SENSING DEVICE FORMED OF CHARGE COUPLED DEVICES

BACKGROUND OF THE INVENTION

1. Field of the Invention

The present invention relates to an improvement of highly integrated structure of charge coupled devices and to an improvement of highly integrated structure of solid state sensing devices employing the charge coupled devices. The present invention is also related to a method for fabricating the solid state image sensing device.

2. Description of the Background Art

A solid state image sensing device is used in a TV camera, a video camera and so on, which converts optical images into electrical signals to pickup the images. A charge transfer device is used as an apparatus for transferring the converted electrical signals in a prescribed operation.

A charge transfer device transfers charges stored on a surface of or in a semiconductor successively to a prescribed direction along the surface. The charge transfer devices are applied to solid state image sensing devices, memories and so on. There are two types of charge transfer devices having different types of transfer electrodes. One type of the charge transfer devices has a unitary transfer gate extending continuously along the direction of the charge transfer. The charge transfer device of this type is disclosed in, for example, U.S. Pat. No. 4,760,273. Another type of the charge transfer devices has a plurality of transfer electrodes arranged along the direction of charge transfer. The charge transfer device of this type is called a charge coupled device (CCD), and the present invention is related to the CCD. When a plurality of MOS capacitors are arranged close to each other so that the depletion regions of the capacitors are overlapped with each other and potential wells are coupled with each other, externally applied charges are transferred as charge packets from positions having higher potential to positions having lower potential. The CCD utilizes the above described phenomenon. More specifically, when a clock voltage is applied to gate electrodes of a number of charge coupled MOS capacitors, charge packets are successively transferred along a channel formed on a surface of a semiconductor substrate.

A planar type CCD has been known in which MOS capacitors are arranged on a main surface of a semiconductor substrate along the direction of transfer to form a charge transfer region. Now, in a CCD employed in a solid state image sensing device, a photosensitive region and the charge transfer region of the CCD are arranged in two dimensions on the main surface of the semiconductor substrate. In such a solid state image sensing device, the degree of integration and opening ratio must be increased to improve resolution and sensitivity. The opening ratio means the proportion of the area of the photosensitive region occupying the surface of the substrate. The degree of integration means the number of elements included in a unit area. However, as the degree of integration becomes higher, the proportion of the surface area occupied by the CCD is increased and the opening ratio is lowered. Consequently, the sensitivity is lowered, preventing the improvement of resolution.

In view of the foregoing, a CCD having structure enabling higher degree of integration has been proposed. Such a CCD is disclosed in, for example, Japanese Patent Laying-Open Gazette NO. 290175/1987. FIG. 12 is a perspective cross sectional view showing the structure of the CCD shown in the above mentioned gazette and FIG. 13 is a plan view of the structure. A plurality of trenches 2b, 2c, 2d and 2e extending parallel to each other are formed on a main surface of a p type silicon substrate. An insulating film 3 formed of silicon oxide is formed over the surface of the p type silicon substrate 1 and inner surfaces of the trenches 2b to 2e. Electrodes 4b, 4c, 4d and 4e elongated along the trenches are formed in the trenches 2b to 2e. Channel regions 5 of n type impurity regions are formed in contact with the inner surfaces of the trenches 2b to 2e in the p type silicon substrate 1. Each of the channel region 5 is divided into four regions I to IV. The regions I and II are opposed to an electrode 4a with an insulating film 3 interposed therebetween. The region I is an n⁻ region and the region II is an n region. The regions III and IV are formed opposed to the electrode 4b with the insulating film 3 interposed therebetween. The region III is an n⁻ region and the region IV is an n region. A portion of the region II is in contact with a portion of the region III. The electrodes 4a, 4c and 4e are connected to a clock pulse source $\phi1$, while the electrodes 4b and 4d are connected to a clock pulse source $\phi2$. Clock voltages having different phases are applied from the clock pulse sources $\phi1$ and $\phi2$. In operation, the charges stored in the channel regions 5 are successively transferred in the direction of the arrow 6 in accordance with the height of the potential wells formed by the high level voltage VH and the low level voltage VL applied from the clock pulse sources $\phi1$ and $\phi2$.

As described above, in the prior art, a trench is formed on a main surface of a substrate, transfer electrodes are formed therein and a channel region is formed on a sidewall of the trench in order to realize the fine structure of a CCD. The fine structure is realized by reducing horizontal area occupied by the charge transfer region formed on the main surface of the silicon substrate.

An example of the prior art will be described with reference to FIGS. 14 and 15 in which the degree of integration is increased to enhance the resolution in a solid state image sensing apparatus employing CCDs. This example is disclosed in, for example, Japanese Patent Laying-Open Gazette No. 51254/1987. Referring to FIGS. 14 and 15, the solid state image sensing device comprises an arrangement of photosensitive regions 8 and vertical charge transfer regions 9 formed on a surface of a silicon substrate 7. Each photosensitive region 8 comprises a p well region 10 provided on the n type silicon substrate 7 and an n type impurity region 11 formed on the surface of the region 10, thereby providing a pn junction. Photoelectric charges excited by light entering the photosensitive region 8 are stored in the pn junction region. A plurality of electrodes are arranged adjacent to the photosensitive regions 8 in the direction of the column of FIG. 14, thereby providing CCDs of the vertical charge transfer regions 9. The electrodes 4 are connected to each other in the row direction by means of leads 12. The electrode 4 is formed in a trench 2 provided on the main surface of the silicon substrate 7 with an insulating film 3 interposed therebetween. A plurality of electrodes are aligned in the column direction, and end portions of alternate electrodes are laid over upper portions of the remaining ones of the electrodes. Every other ones of the electrodes 4 have gate electrode portions 13 for transferring the photoelectric charges stored in the photosensitive regions 8 to the n channel regions 5 of the CCDs. An n type impurity region 5 forming the n channel region is formed in the inner surface region of the trench 2.

As described above, the solid state image sensing device of the prior art comprises a plurality of photosensitive regions 8 arranged in a matrix and CCDs (vertical charge transfer regions 9) for transferring the photoelectric charges generated in the photosensitive regions 8 in the vertical direction, each of which connected to each of the photosensitive regions 8. The CCDs are alternately aligned with the lines of the plurality of photosensitive regions 8 arranged in the column direction. By providing the electrode 4 and the n channel region 5 for charge transfer of the CCD in the trench 2, the horizontal area occupied by the vertical charge transfer region 9 is reduced, thereby improving the opening ratio of the photosensitive region 8.

The operation of the solid state image sensing device of the above described prior art will be described in the following. The light entering the photosensitive region 8 excites photoelectric charges in this region, and the photoelectric charges are stored in the pn junction region. When a positive pulse is applied to the electrode 4 having the gate electrode portion 13, an n channel (not shown) is formed on the surface of the silicon substrate below the gate electrode portion 13, so that the charges stored in the photosensitive region 8 are transferred to the n channel region 5 of the CCD. Thereafter, a driving clock signal is applied to the plurality of electrodes 4, whereby the charges stored in the n channel regions 5 of the CCD are transferred in the vertical (column) direction through the n channel region 5. When all the charges of 1 pixel are transferred in the vertical direction, the charges of 1 pixel are transferred to the CCD for horizontal transfer (not shown) on the end portion of CCD for vertical transfer and then transferred in the horizontal (row) direction. When the charges transferred to the CCD for horizontal transfer are transferred in the horizontal direction to be outputted, then the driving clock signal is again applied to the plurality of electrodes 4. Therefore, the charges are transferred in the vertical direction by 1 pixel, the charges of 1 pixel on the end portion of the CCD for vertical transfer are transferred to the CCD for horizontal transfer, and they are transferred in the horizontal direction by the CCD for horizontal transfer to be outputted. By the repetition of the above described operation, output signals corresponding to the light incidental to the photosensitive regions 8 are provided.

As described above, in the conventional CCD or in the solid state image sensing device employing CCDs, trenches are formed in the surface of the silicon substrate, and the CCDs are formed in the trenches in order to realize highly integrated structure or fine structure and to reduce the horizontal area of occupation. However, these structures are only partial modifications of the conventional planar type structure, which is formed in the trench in the substrate surface. Therefore, in the above described solid state image sensing device, the horizontal arrangement of the photosensitive regions and the charge transfer regions is the same as in the conventional planar type structure. Therefore, the reduction of the horizontal area occupied by the charge transfer regions on the surface of the substrate and the improvement of the degree of integration are limited.

SUMMARY OF THE INVENTION

An object of the present invention is to reduce horizontal area occupied by CCDs formed on a semiconductor substrate.

Another object of the present invention is to improve opening ratio of a solid state image sensing device.

A further object of the present invention is to miniaturize the structure of the solid state image sensing device.

A still further object of the present invention is to provide a method for manufacturing a solid state image sensing device having a fine structure.

In accordance with an aspect of the present invention, the charge coupled device is formed on a semiconductor substrate having a trench. On one of the two side surfaces of the trench formed are impurity regions of a second conductivity type and charge transfer electrodes on the surface of the impurity regions with insulating film posed therebetween. The plurality of charge transfer electrodes are arranged along a longitudinal direction of the trench. In the same manner, impurity regions, insulating films and charge transfer electrodes are formed on the other one of the sidewalls of the trench. Insulating and isolating means is formed at the bottom of the trench for insulating and isolating impurity regions on both sidewalls from each other.

Namely, two charge coupled devices independent from each other are formed on both side surfaces of a trench formed in the surface of the semiconductor substrate. Therefore, compared with the prior art device in which one charge transfer device is formed in one trench, the degree of integration of the device can be increased.

In another aspect of the present invention, a solid state image sensing device comprises a semiconductor substrate having a trench on the main surface of thereof. On a pair of main surface regions of the semiconductor substrate near the trench, a first line of photoelectric converting elements and a second line of photoelectric converting elements are arranged. First charge transfer elements and second charge transfer elements corresponding to the first and second lines of photoelectric converting elements are separately formed on the two side surfaces of the trench. The first and second charge transfer elements are electrically insulated and isolated from each other by insulating and isolating means formed at the bottom of the trench.

By the virtue of the above described structure, the number of trenches formed on the surface of the semiconductor substrate can be reduced in association with the number of the corresponding photosensitive regions, whereby the degree of integration can be increased, the opening ratio of the photosensitive regions is improved, and the resolution of the solid state image sensing device can be enhanced.

According to a further aspect of the present invention, a method for manufacturing a solid state image sensing device comprises the steps of:
  a. selectively forming an insulating film for separating elements on a surface of a semiconductor substrate having a first conductivity type;
  b. forming a first impurity region of a second conductivity type on the surface of the semiconductor substrate;
  c. forming a trench in a prescribed region of the surface of the semiconductor substrate;

d. forming second impurity regions of the second conductivity type on both side surfaces of the trench;

e. forming a third impurity region of the first conductivity type having higher impurity concentration between the main surface of the semiconductor substrate and the second impurity regions;

f. forming a first insulating film on the main surface of the semiconductor substrate and in the trench;

g. forming a polycrystalline silicon layer on the surface of the first insulating film and patterning the same into a prescribed pattern;

h. forming a second insulating film on the surface of the first insulating film and the polycrystalline silicon layer;

i. applying a resist on the surface of the polycrystalline silicon layer and patterning the same to expose the surface of the second insulating film formed in the trench;

j. anisotropically etching the second insulating film with the resist serving as a mask to expose the surface of the polycrystalline silicon layer formed on the bottom portion of the trench; and k. etching the polycrystalline silicon layer using the resist and the second insulating film as masks.

Therefore, two charge transfer devices insulated and isolated from each other can be easily manufactured in a trench.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following with reference to the figures.

Figure 1:
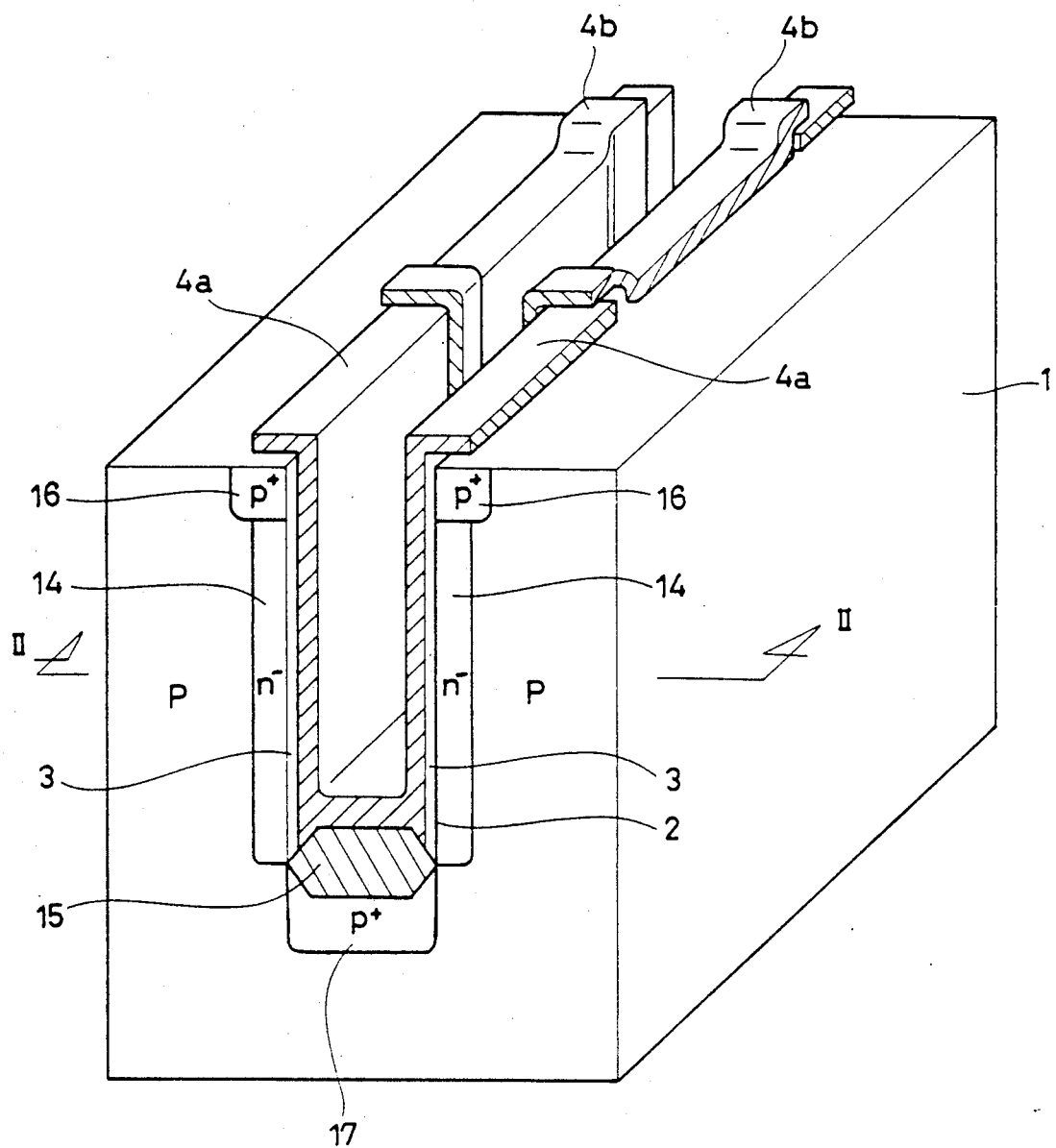
FIG. 1 is a perspective cross sectional view showing a structure of a charge transfer device in accordance with one aspect of the present invention.

FIG. 1 is a perspective cross sectional view of a charge transfer device showing one embodiment in accordance with a first aspect of the present invention. Referring to FIG. 1, a p type silicon substrate 1 comprises a trench 2 formed in the "vertical" direction of the main surface thereof. The trench 2 having vertical sidewall surfaces is formed elongate in the direction of the main surface. $n^-$ impurity regions 14, 14 are formed on both side surfaces of the trench 2. An oxide film 15 for isolation is formed on a bottom portion of the trench 2 between the opposing $n^-$ impurity regions 14, 14. The oxide film 15 for isolation is formed by LOCOS (Local Oxidation of Silicon) method. A channel stopper 17 is formed below the oxide film 15 for isolation. The channel stopper 17 is provided to avoid a mixture of signal charges caused by two n channel regions 14 and 14 being in contact with each other at the bottom portion of the trench 2.

Surface channel stop layers 16 which are $p^+$ impurity regions having the impurity concentration higher than the p type silicon substrate 1 are formed on the upper portions of the $n^-$ impurity regions 14 and 14. The surface channel stop layers 16, 16 are provided for preventing the charge packets in the $n^-$ type impurity regions 14 being trapped to the surface of the substrate to decrease the transfer efficiency in operation. By the provision of the surface channel stop layers 16, a so-called buried channel CCD is provided.

Electrodes 4 formed of polysilicon are formed on the inner side surfaces of the trench 2 and the surface of the p type silicon substrate 1. A plurality of electrodes 4a, 4b are arranged along the longitudinal direction of the L trench 2. Every other ones of the electrodes 4b have their side portions laid over the remaining ones of the electrodes 4a.

As described above, in the CCD of this embodiment, two charge transfer regions electrically insulated and isolated from each other by an oxide film 15 for isolation formed on the bottom portion of the trench 2 are formed on both side surfaces of the trench 2. Consequently, the area occupied by the charge transfer regions of the surface of the silicon substrate 1 is considerably reduced, enabling higher degree of integration.

Figure 2:
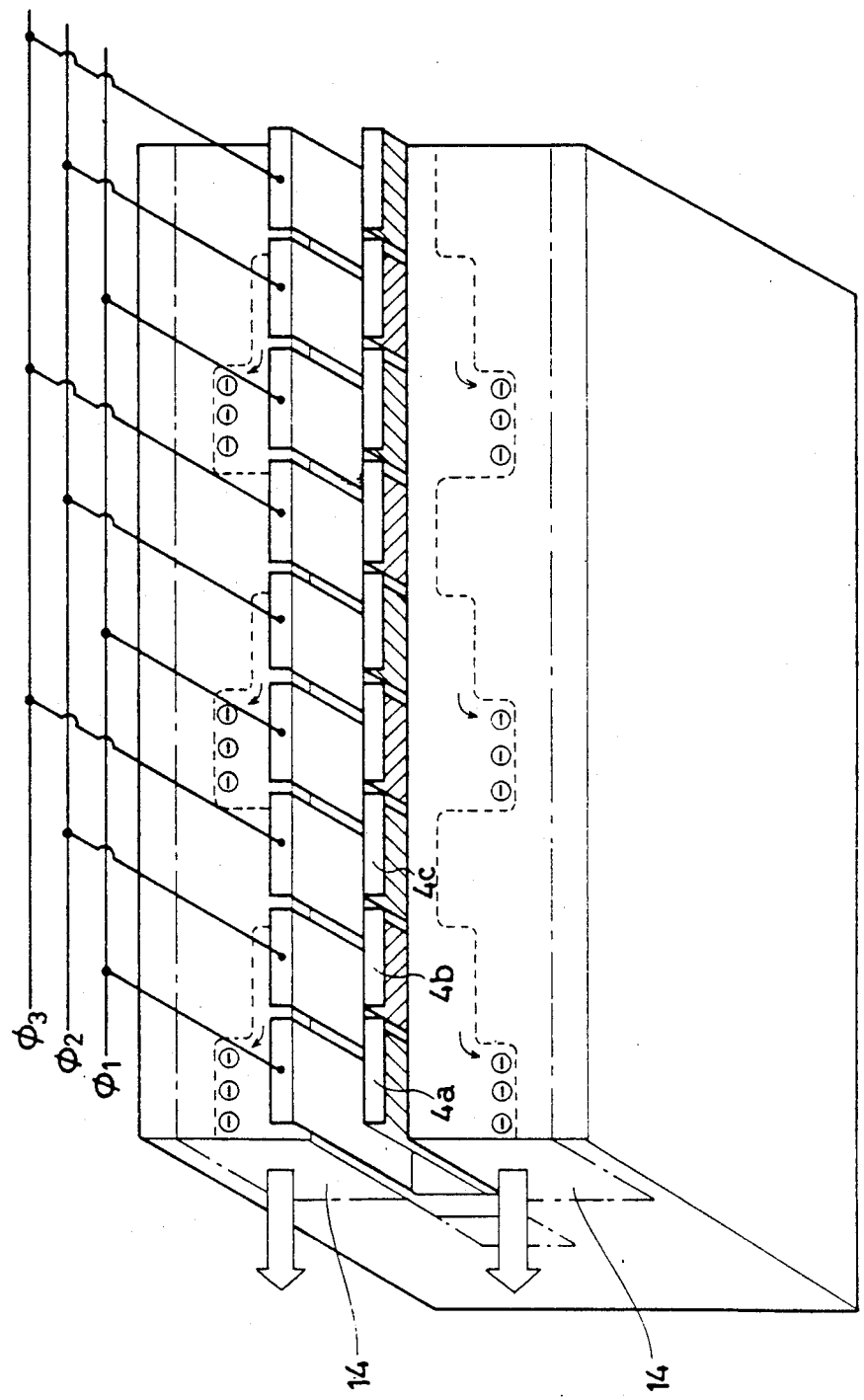
FIG. 2 is a schematic diagram illustrating the operation of the charge transfer device shown in FIG. 1.

The operation of the CCD in accordance with the present embodiment will be described with reference to FIG. 2. FIG. 2 schematically shows the structure of the CCD shown in FIG. 1. The overlapping portions between the electrodes 4a and 4b of FIG. 1 are omitted. FIG. 2 shows a state of operation of a three-phase CCD. A plurality of electrodes 4a, 4b are arranged along the longitudinal direction of the trench 2. A group of three electrodes 4a, 4b, 4c are connected to a three phase clock voltage source $\phi 1$, $\phi 2$ and $\phi 3$ through electrode wirings. In operation, electrons, which are the transfer charges, are introduced into the charge transfer region 14 by any means, and a clock voltage is applied such that the voltages of the electrodes 4a, 4b, 4c will be $\phi 1 > \phi 2 > \phi 3$. Then, the electrons gather in a bottom portion of a potential well formed in the silicon substrate at a position opposing to the $\phi 1$ electrode having the lowest potential due to the drift and thermal diffusion. Thereafter, a clock voltage is applied to the electrode 4a, 4b, 4c such that $\phi 3 > \phi 1 > \phi 2$. Consequently, the potential in the potential well formed in a portion of the silicon substrate opposing the $\phi 3$ electrode become the lowest. Consequently, the electrons gather in the portion of the silicon substrate opposing the $\phi 1$ electrode are transferred to the portion of the silicon substrate opposing the $\phi 3$ electrode. Thereafter, a clock voltage is applied to the electrodes 4a, 4b, 4c such that $\phi 2 > \phi 3 > \phi 1$. Then, the electrons gather in the portion of the silicon substrate opposing $\phi 3$ electrode are transferred to the bottom portion of the potential well at a position of the silicon substrate opposing the $\phi 2$ electrode. By repeating the above described operation, the electrons in the charge transfer regions are transferred in the direction of the arrow of FIG. 2.

Figure 3:
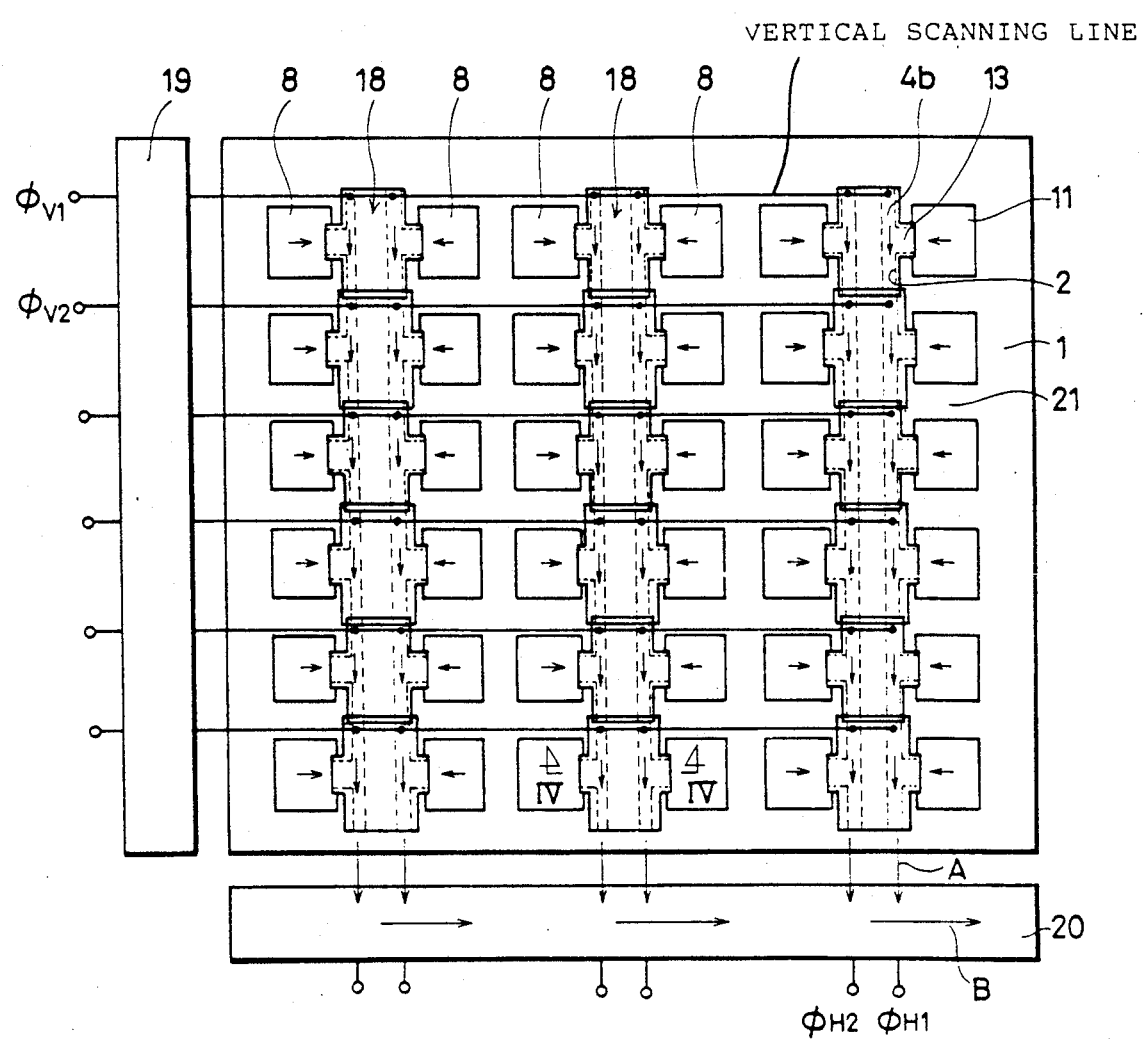
FIG. 3 is a schematic plan view showing a horizontal structure of a solid state image sensing device in accordance with a second aspect of the present invention.
Figure 14:
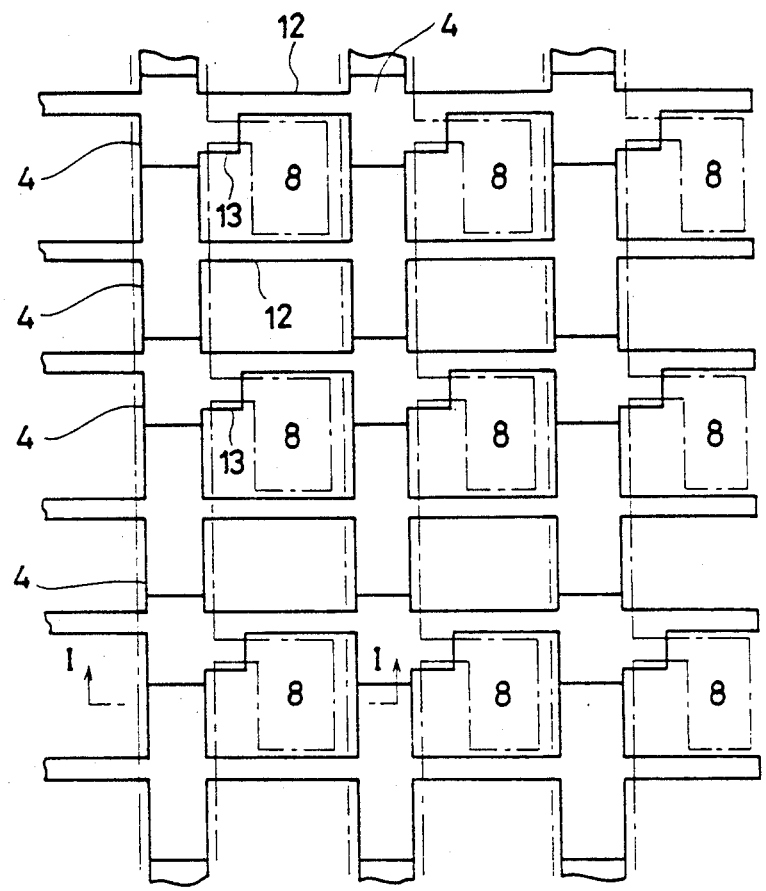
FIG. 14 is a plan view showing a horizontal structure of a conventional solid state image sensing device.
Figure 15:
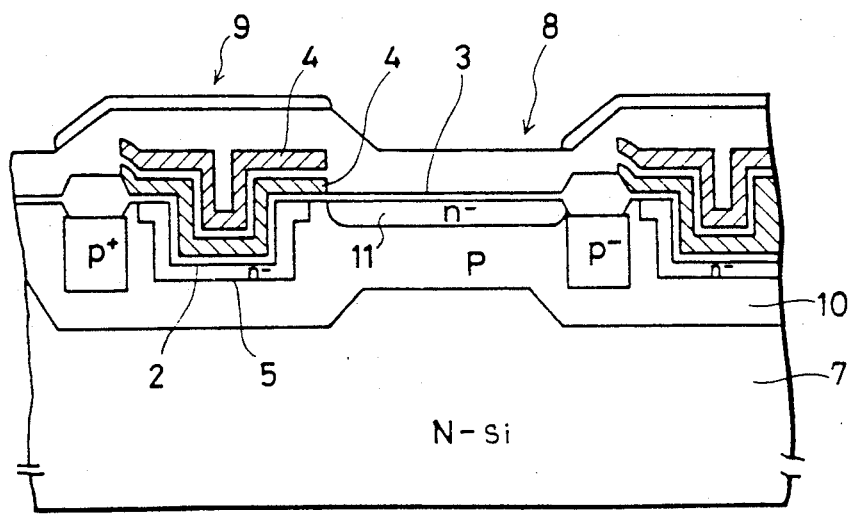
FIG. 15 is a cross sectional view taken along the line I—I of FIG. 14.

A first embodiment of a solid state image sensing device in accordance with a second aspect of the present invention will be described in the following. FIG. 3 is a plan view schematically showing a horizontal structure of the solid state image sensing device. Referring to FIG. 3, the solid state image sensing device comprises a plurality of photosensitive regions 8 (pixels) for generating image signals, vertical transferring CCDs 18 for transferring the image signals received by photosensitive regions 8 in the vertical direction, a vertical shift register 19 for generating signals for transferring image signals by means of the vertical transferring CCDs 18, and a horizontal transferring CCD 20 for transferring the image signals transmitted by the vertical transferring CCDs 18 in the horizontal direction. The vertical transferring CCDs 18 are formed between every other lines of the photosensitive regions 8. In the conventional solid state image sensing device, the lines of the photosensitive regions 8 and the vertical transferring CCDs 18 are arranged alternately. Therefore, the structure of the first embodiment is capable of reducing the horizontal area occupied by the vertical transferring CCDs 18 and increasing the opening ratio, as compared with the prior art shown in FIG. 14, for example. In one embodiment, the opening ratio as high as 75% is realized.

The principle of operation of the solid state image sensing device of a first embodiment will be described with reference to FIG. 3. First, signal charges are stored in the photoelectric converting region 8 for a prescribed period. Thereafter, a voltage high enough to open the reading gate is applied to $\phi_{V1}$ and $\phi_{V2}$ of the vertical shift register 19, whereby the signal charges stored in the photoelectric converting region 8 pass the reading gate altogether to flow in the vertical transferring CCDs 18. Thereafter, the voltage applied to $\phi_{V1}$ and $\phi_{V2}$ of the vertical shift register 19 is lowered so as to close the reading gate. At the same time, the vertical CCDs 18 are operated by applying voltages alternately to $\phi_{V1}$ and $\phi_{V2}$, so as to transfer the signal charges in the direction of the arrow A. A line of vertical CCDs are capable of simultaneously transferring the signal charges in the photoelectric converting region 8, 8 on both sides thereof. The signal charges reached the horizontal transferring CCD 20 are transferred in the direction of the arrow B by the clock operation of $\phi_{H1}$ and $\phi_{H2}$. Signal charges of each pixel are extracted by the transferring operation. By repeating the above described operations, ever changing images can be obtained.

Figure 4:
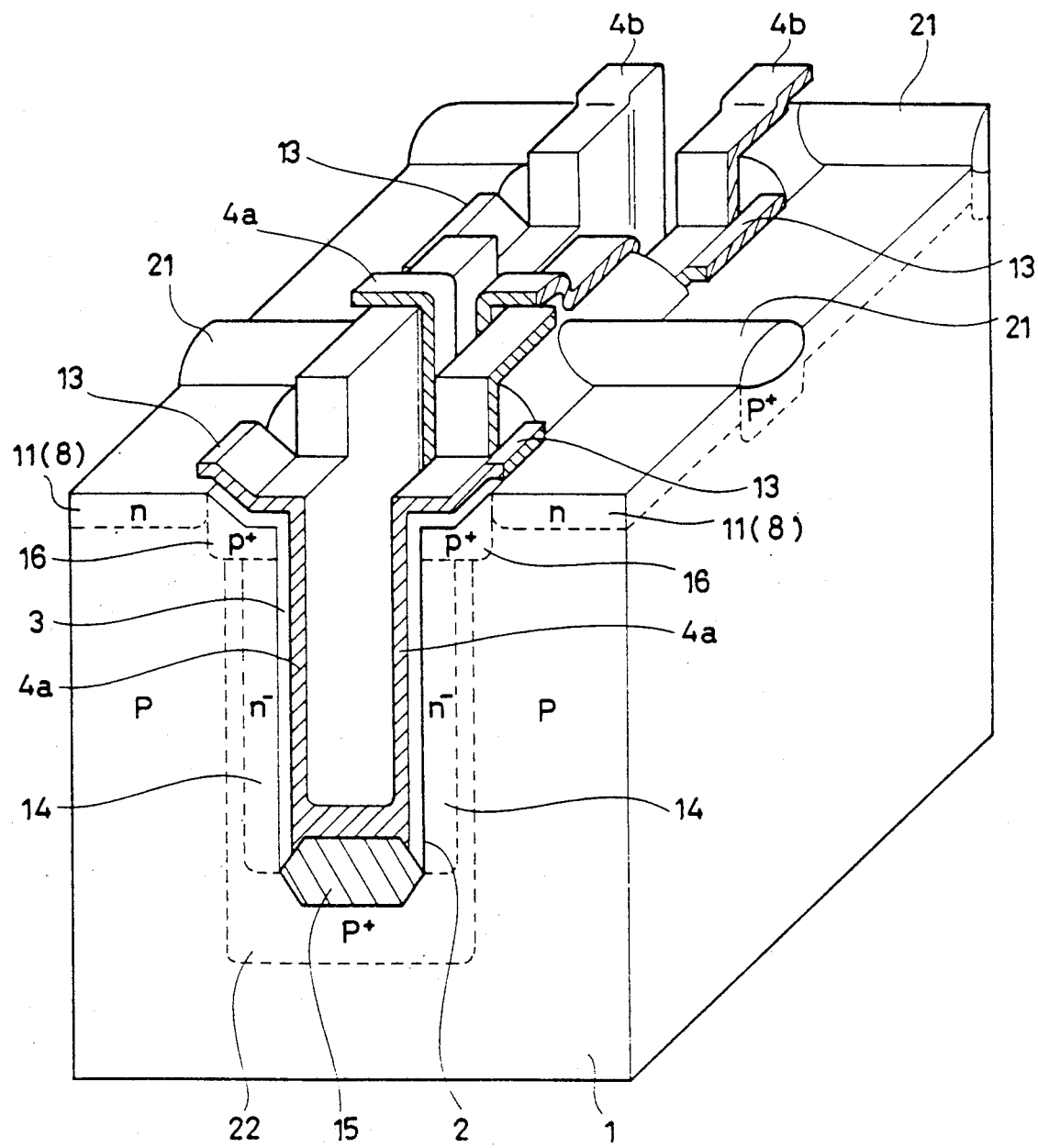
FIG. 4 is a perspective cross sectional view showing a cross sectional structure of the device of FIG. 3 taken from the line IV—IV of FIG. 3.

FIG. 4 is a perspective cross sectional view of a portion shown by the line IV-IV of FIG. 3, showing a schematic structure of the vertical transferring CCD 18. The characteristic of the structure of the vertical transferring CCD 18 in accordance with the present embodiment is that two vertical transferring CCDs 18, 18 independent from each other are formed on both side surface portions of a trench formed in a semiconductor substrate. More specifically, referring to FIG. 3 and FIG. 4, one trench among trenches shown in FIG. 3 is formed parallel to each other extending in the column direction on the surface of a p type silicon substrate 1. $n^-$ impurity regions 14, 14 which will be channel regions are formed on both side surfaces of the trench 2. n type impurity regions 11 are formed on the surface of the p type silicon substrate 1, which portions constitute the photosensitive regions 8. The photosensitive regions 8 are insulated and isolated from each other by an oxide film 21 for isolation. An oxide film 15 for isolation is provided on a bottom portion of the trench 2 for isolating and insulating the $n^-$ impurity regions 14, 14 from each other. Surface channel stop layers 16, 16 which are $p^+$ impurity regions having higher concentration are formed between the upper portion of the $n^-$ impurity regions 14, 14 and the surface of the p type silicon substrate 1. A potential barrier 22 which is a $p^+$ impurity region having higher concentration is formed surrounding the $n^-$ impurity regions 14, 14. Electrodes 4a, 4b formed of silicon is formed on the inner surface of the trench 2 and the surface of the p type silicon substrate 1 with an insulating film 3 interposed therebetween. A plurality of electrodes 4a, 4b are arranged in the longitudinal direction of the trench 2 corresponding to the photosensitive regions 8. A portion of each of the gate electrode 4a, 4b comprise a gate electrode 13 of a transfer gate for reading signal charges from the photosensitive region 8.

The method of manufacturing the solid state image sensing device shown in FIG. 4 will be described in the following with reference to FIGS. 4A to 4H.

Figure 4A:
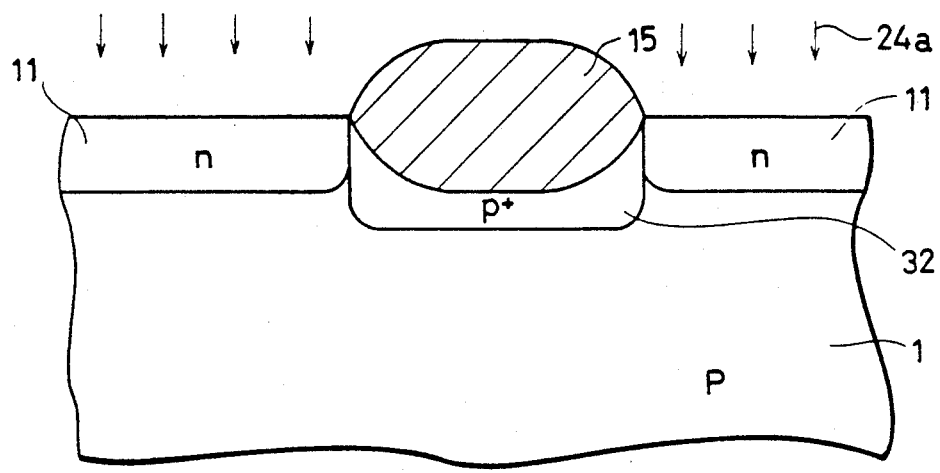
FIGS. 4A to 4H are cross sectional views showing the steps of manufacturing the solid state image sensing device shown in FIG. 4.

Referring to FIG. 4A, a channel stopper 32 formed of a p type impurity region having higher concentration than the substrate is formed on a prescribed region of a surface of a p type silicon substrate 1, and an oxide film 15 for isolating element is formed by the LOCOS method on the channel stopper 32. Thereafter, n type impurities 24a are ion implanted to the surface of the p type silicon substrate 1 to form n type impurity regions 11 which will be the photosensitive regions 8.

Figure 4B:
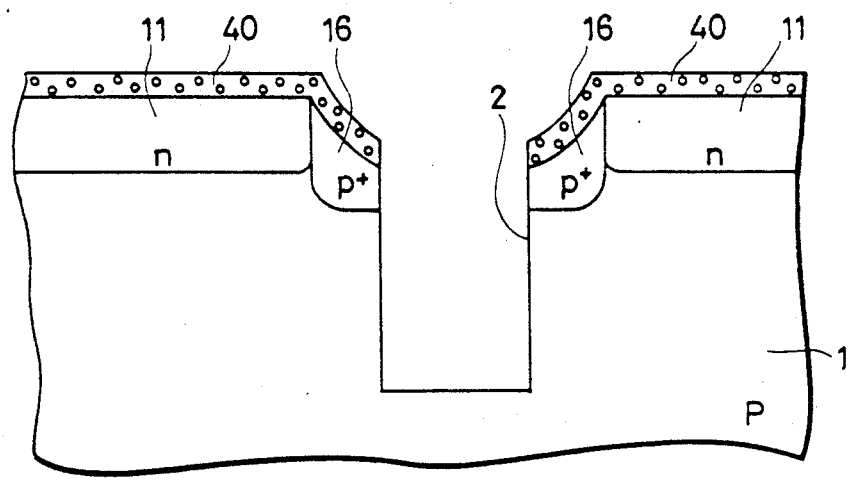

Referring to FIG. 4B, the oxide film 15 for isolation on the surface of the p type silicon substrate 1 is selectively removed by etching. Thereafter, a trench 2 is formed by etching at a position where the oxide film 15 for isolation is removed, by using a resist pattern 40 as a mask. On this occasion, the channel stopper 32 remains on the upper portion of the trench 2, the remaining channel stopper 32 forming a surface channel stop layer 16 of the CCD.

Figure 4C:
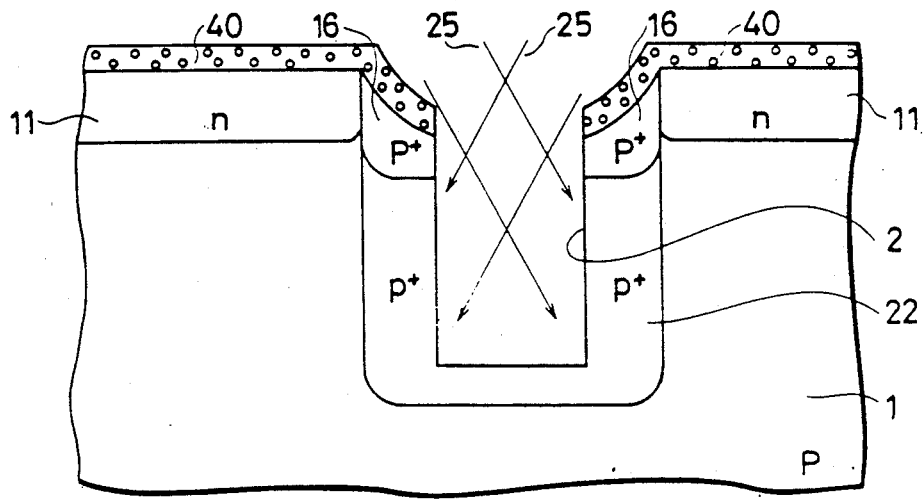

Referring to FIG. 4C, p type impurity ions 25 are introduced to both side surfaces of the trench 2 by oblique ion implantation, thereby forming potential barriers 22 formed of p+impurity regions having higher concentration.

Figure 4D:
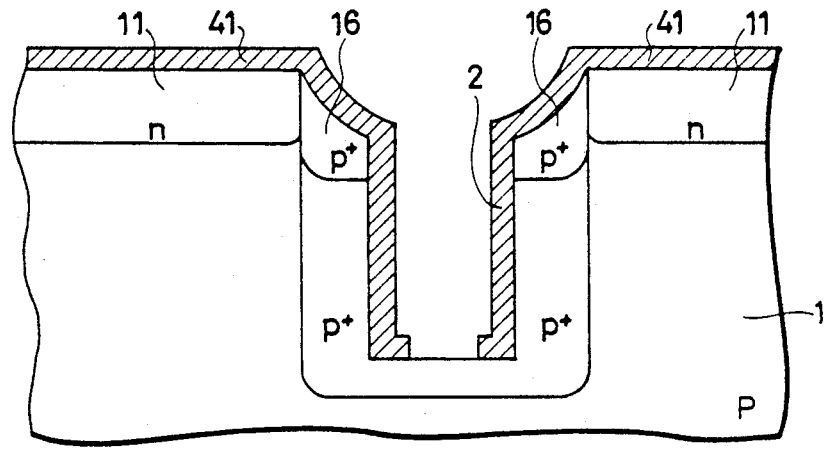

Referring to FIG. 4D, a silicon nitride film 41 is formed on the surface of the p type silicon substrate 1 and in the trench 2. The silicon nitride film 41 is patterned so as to expose the surface of the p type silicon substrate 1 only in the trench 2.

Figure 4E:
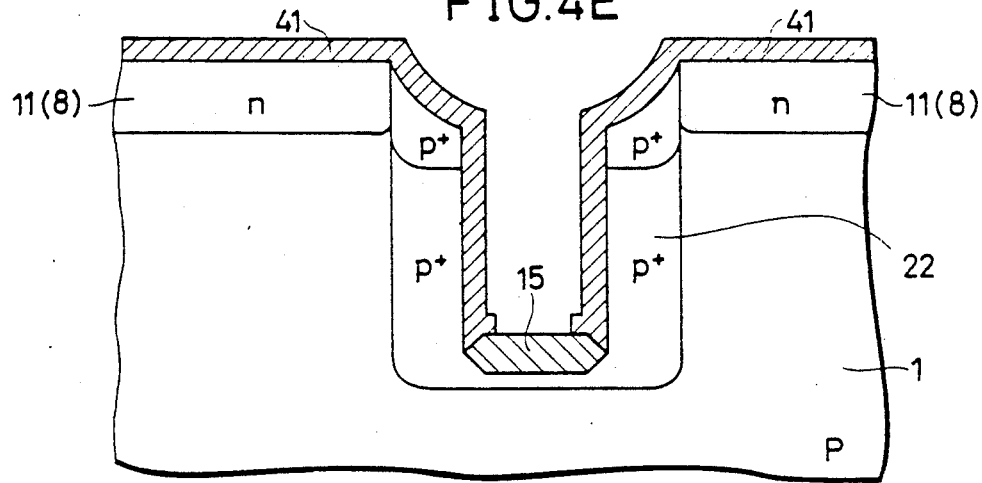

Referring to FIG. 4E, the surface of the p type silicon substrate 1 exposed at the bottom of the trench 2 is selectively oxidized by thermal oxidation using the silicon nitride film 41 as a mask. By this step, the oxide film 15 for isolation is formed on the bottom of the trench 2. The method of forming the oxide film for isolation at the bottom of the trench is described in detail in U.S. Ser. No. 041,672.

Figure 4F:
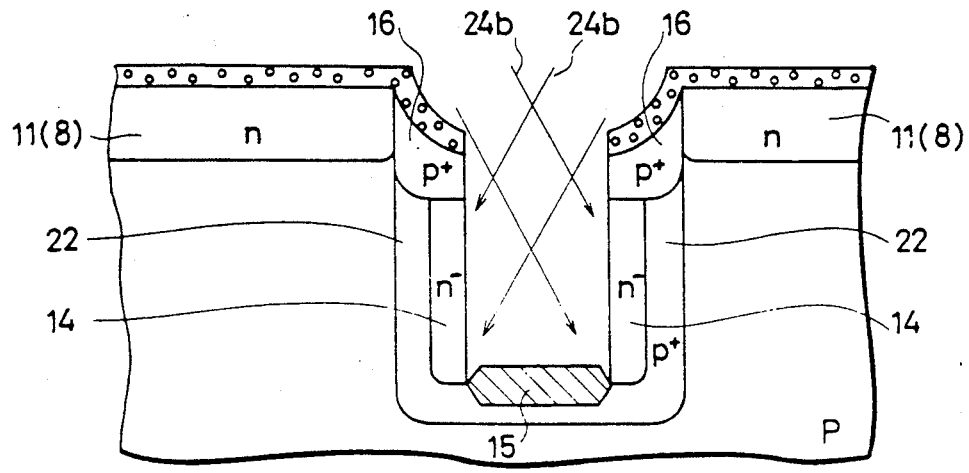

Referring to FIG. 4F, the silicon nitride film 41 is removed and thereafter, n type impurity ions 24b are introduced to both side surfaces of the trench 2, again by oblique ion implantation. By this ion implantation, the n−impurity regions 14, 14 constituting n channel are formed.

Figure 4G:
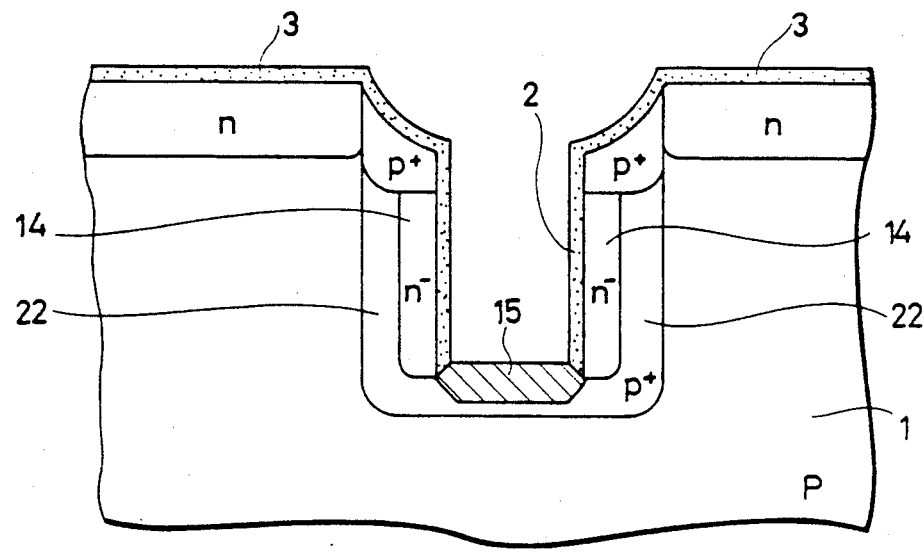

Referring to FIG. 4G, a gate oxide film 3 is formed on the surface of the p type silicon substrate 1.

Figure 4H:
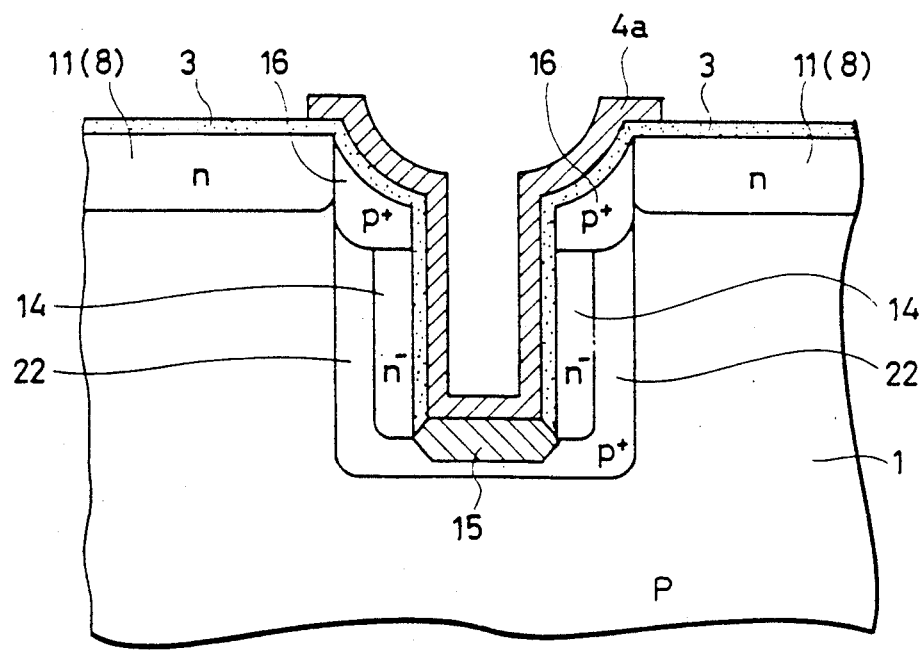

Referring to FIG. 4H, a polycrystalline silicon layer is formed on the surface of the gate oxide film 3 and the polycrystalline silicon layer is patterned to have a prescribed shape. By doing so, the charge transfer electrodes 4a and 4b are formed. Thereafter, the surface of the p type silicon substrate 1 is covered with an insulating film.

The method of oblique ion implantation to the sidewalls of the trench employed in the above described manufacturing process is disclosed in detail in, for example, "Depth Profiles of Boron Atoms with Large Tilt-Angle Implantations; G. Fuse et al., J.E.S: Solid-State Science and Technology", 1986 Vol. 133. No. 5, p996. More specifically, the impurity ions can be implanted to the entire surface of the trench sidewall by tilting the incident angle of the impurity ions.

Figure 5A:
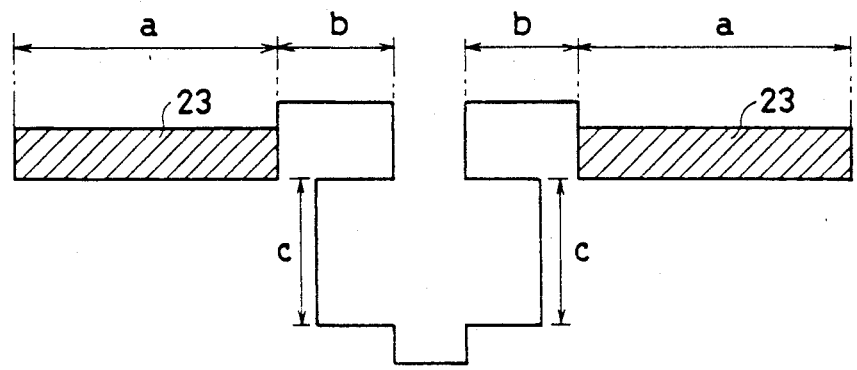
FIGS. 5A. 5B and 5C are cross sectional views illustrating the operation of the solid state image sensing device shown in FIGS. 3 and 4.

The operation of the solid state image sensing device of the present embodiment will be described in the following with reference to FIGS. 5A to 5C. These figures illustrate the changes of the potential and signal charges in the photosensitive region, the reading gate region and the charge transferring portion. First, referring to FIG. 5A, signal charges 23 are stored in the photosensitive region 8 corresponding to the incidental light. At this time, the reading gate is closed.

Figure 5B:
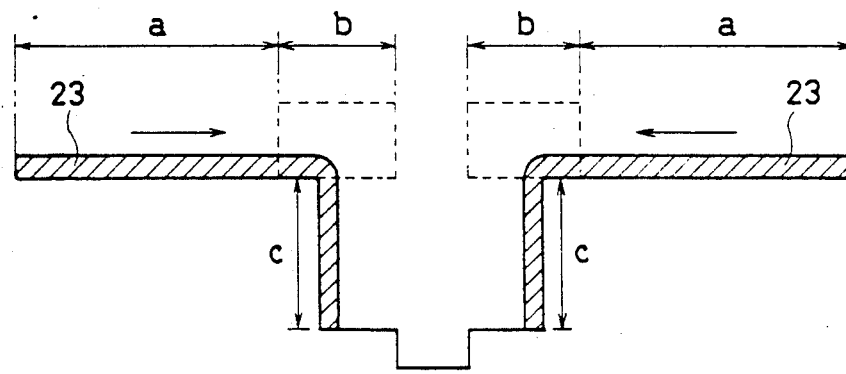

Referring to FIG. 5B, after charges are stored in the photosensitive region 8 for a prescribed time period, the reading gate is opened and simultaneously, the signal charges stored in the photosensitive region are read to the charge transferring portion.

Figure 5C:
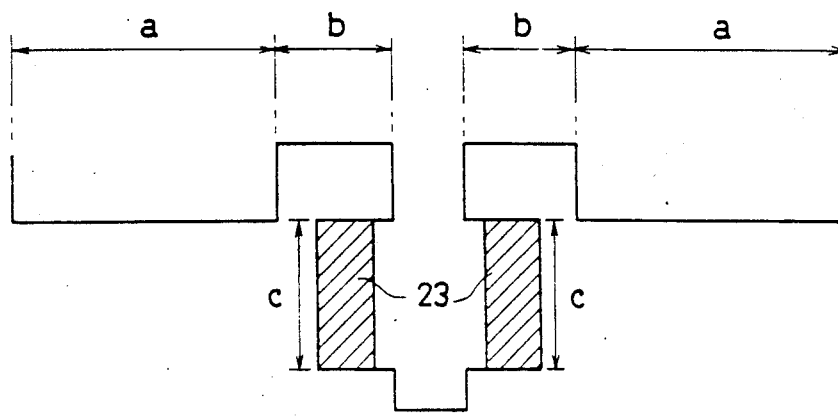

Referring to FIG. 5C, the reading gate is again closed, and the signal charges are transferred in a prescribed direction by means of a vertical transferring CCD constituting the charge transferring portion.

By the repetition of the above described operation, the signal charges of the line of pixels on both sides can be simultaneously read by two charge transferring means formed in one trench.

Figure 6:
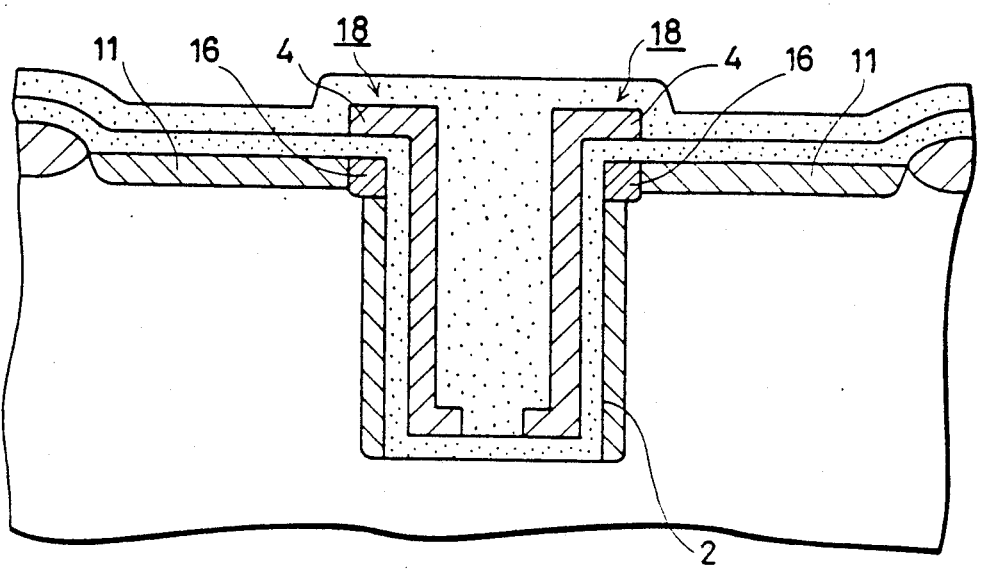
FIG. 6 is a cross sectional view showing another embodiment of the solid state image sensing device in accordance with the second aspect of the present invention.

A second embodiment in accordance with the second aspect of the present invention will be described with reference to FIG. 6. The second embodiment shown in FIG. 6 is different from the structure of the solid state image sensing device shown in FIG. 4 in that means for insulation and isolation formed on the bottom portion of the trench 2 has a different structure. Namely, in the second embodiment, the electrodes 4 formed on the inner surfaces of the trench 2 are isolated from each other at the bottom portion of the trench 2 and an insulating film is filled therebetween. By this structure, the vertical transferring CCD 18 formed on one side side surface of the trench 2 is electrically insulated and isolated from a vertical transferring CCD 18 formed on another side surface of the trench.

By virtue of the above described structure, one vertical transferring CCD 18 can operate completely independent from the other vertical transferring CCD 18. Such CCDs capable of independent operations can be effectively utilized in a CCD memory and the like.

FIGS. 7A to 7H are cross sectional views showing the steps of manufacturing the solid state image sensing device in accordance with the second embodiment. The method for manufacturing the solid state image sensing device shown in FIG. 6 will be described with reference to these figures.

Figure 7A:
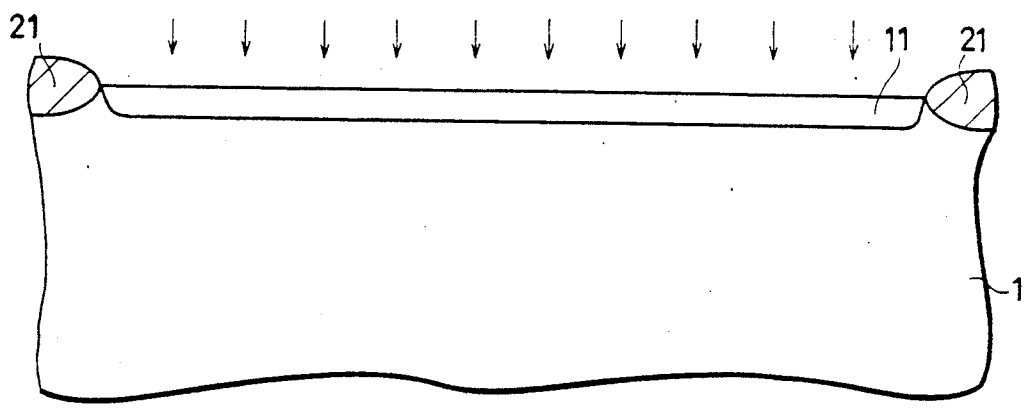
FIGS. 7A, 7B, 7C. 7D, 7E, 7F, 7G and 7H are cross sectional views showing in this order the steps of manufacturing the solid state image sensing device shown in FIG. 6.

First, as shown in FIG. 7A, an oxide film 21 for isolating elements is formed on a prescribed region of a surface of a p type silicon substrate 1 by using the LOCOS method or the like. Thereafter, an n type impurity region 11 which will be the photosensitive region 8 is formed by ion implantation of n type impurities to the surface of the p type silicon substrate 1.

Figure 7B:
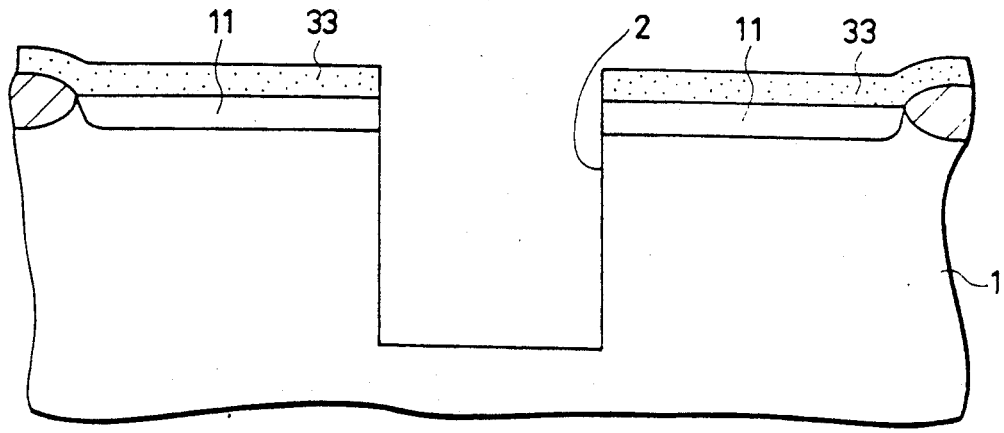

Thereafter, as shown in FIG. 7B, a trench 2 is formed on a prescribed region of the surface of the p type silicon substrate 1 using resist patterns 33 as masks. The width of the trench is, for example, 1 μm.

Figure 7C:
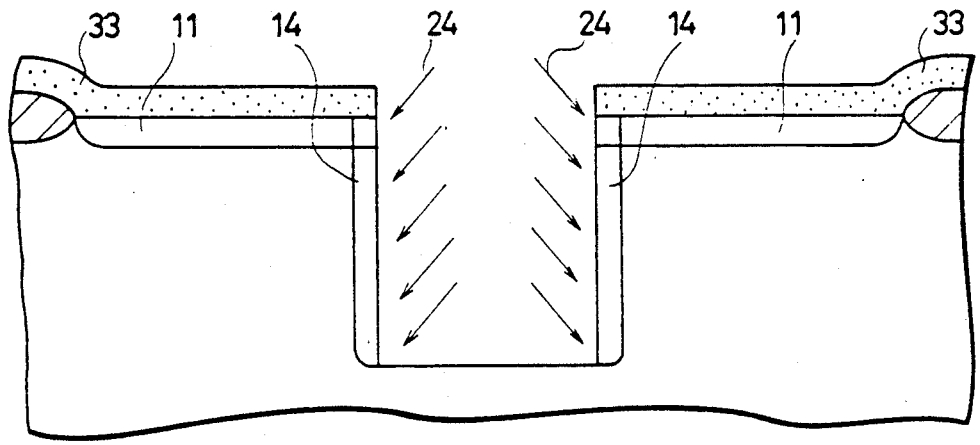

Thereafter, as shown in FIG. 7C, n type impurity ions 24 are implanted on both side surfaces of the trench 2 by oblique ion implantation using the resist patterns 33 as masks, to form n−impurity regions 14, 14 which will be the n channel regions of the CCD. The depths of the n impurity regions 14, 14 to the bottom portion can be controlled by adjusting the incidental angle of the impurity ions.

Figure 7D:
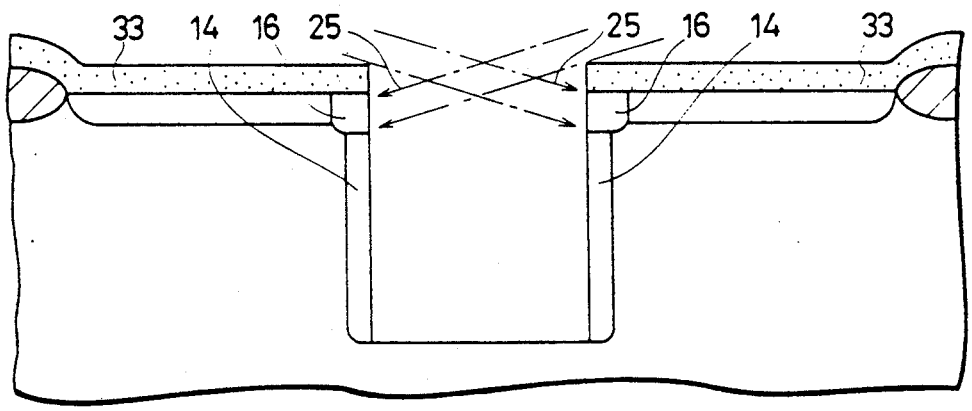

Thereafter, as shown in FIG. 7D, p type impurity regions 16 are formed by ion implantation of boron (B) 25, for example, near the intersecting portions of the upper portions of the trench 2 and the surface of the p type silicon substrate 1 by oblique ion implantation, thereby providing surface channel stop layers 16 which are the p+impurity regions of higher concentration.

The incident angle of the boron ions 25 is selected such that the range of entrance of the boron ions 25 is regulated by the edge of the trench 2. Therefore, the channel stop layer 16 is formed only on the upper portion of the trench 2.

Figure 7E:
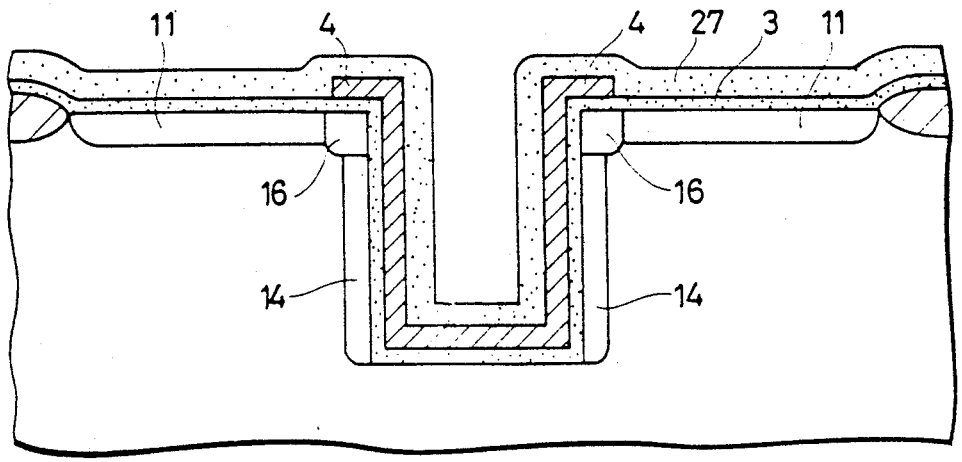

Thereafter, as shown in FIG. 7E, an insulating film 3 such as a silicon oxide film is formed on the surface of the p type silicon substrate 1 and on the inner surface of the trench 2 by thermal oxidation method. Thereafter, a polysilicon layer is formed on the surface of the insulating film 3. The polysilicon layer is patterned to a prescribed shape to form n type electrode 4. Thereafter, a silicon oxide film 27 is formed on the substrate of the electrode 4 and on the surface of the insulating film 3.

Figure 7F:
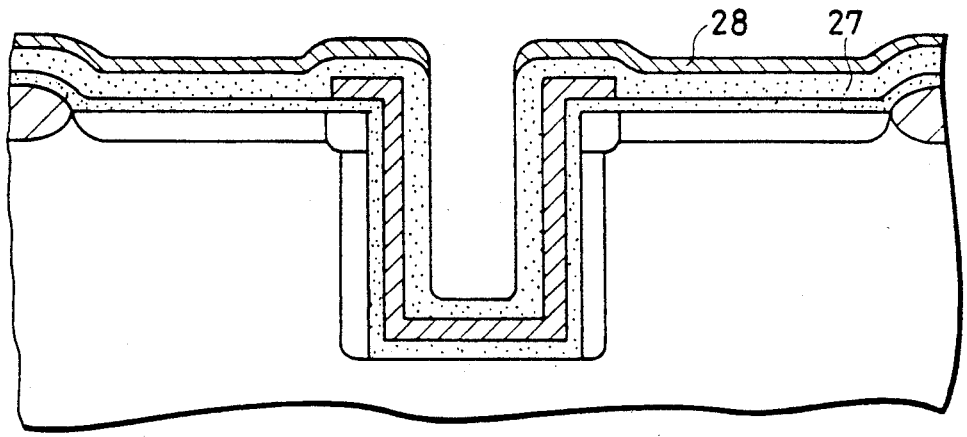

As shown in FIG. 7F, a resist 28 are applied on the surface of the silicon oxide film 27, and the resist is patterned to expose only the surface of the silicon oxide film 27 in the trench 2.

Figure 7G:
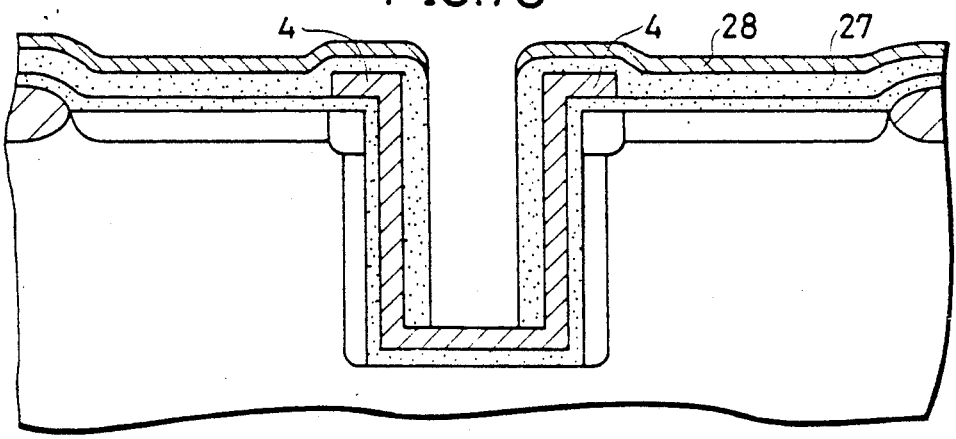

As shown in FIG. 7G, a portion of the silicon oxide film 27 positioned above the bottom portion of the trench 2 is removed by anisotrophic etching, using the patterned resist 28 as a mask. But doing so, the surface of the electrode 4 positioned on the bottom surface of the trench is exposed.

Figure 7H:
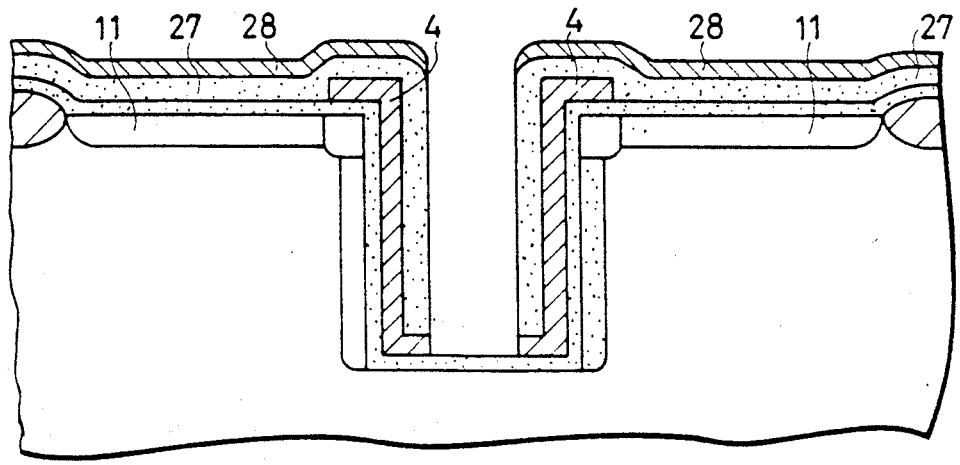

Thereafter, as shown in FIG. 7H, the electrode 4 is anisotropically etched by using the resist 28 and the silicon oxide film 27 as masks, to selectively remove a portion of the electrode 4 positioned on the bottom surface of the trench 2. By doing so, the electrode 4 on one side of the trench 2 is separated from the electrode 4 on the other side surface of the trench.

Thereafter, the resists 28 are removed. Thus, the main portion of the solid state image sensing device having the structure shown in FIG. 6 is provided.

The steps shown in FIGs. 7A to 7D are also employed in manufacturing the above described first embodiment and in manufacturing the structure of other embodiments which will be described later.

Figure 8:
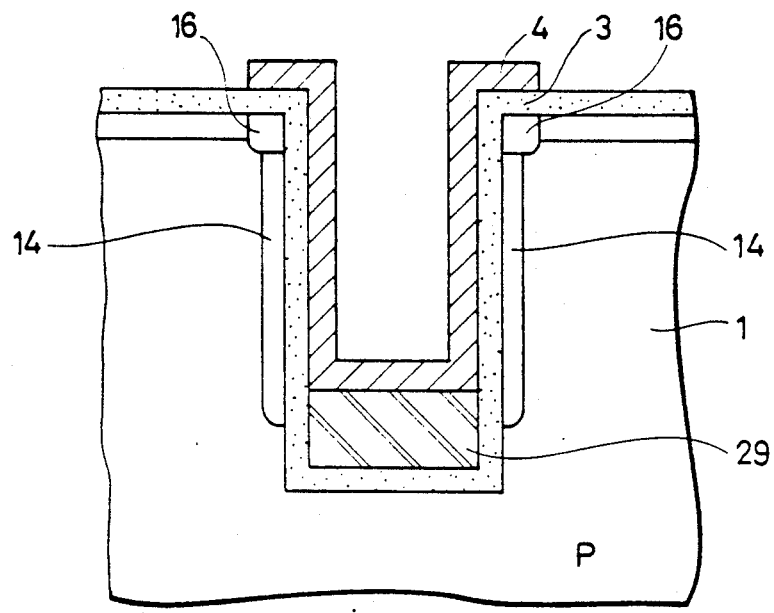
FIG. 8 is a cross sectional view showing a third embodiment of the solid state image sensing device in accordance with the second aspect of the present invention.

A third embodiment of the solid state image sensing device in accordance with the second aspect of the present invention will be described. FIG. 8 is a cross sectional view corresponding to the cross sectional structure of the solid state image sensing device shown in FIG. 4. The third embodiment has a different insulating and isolating structure formed on the bottom portion of the trench 2. Namely, in the third embodiment, a SOG (Spin-on-Glass) layer 29 is formed in the bottom portion of the trench 2 in order to insulate and isolate n⁻impurity regions 14, 14 formed on both side surfaces of the trench 2 from each other. Since the SOG has a low viscosity, it can be easily buried in the bottom portion of a minute trench.

Figure 9:
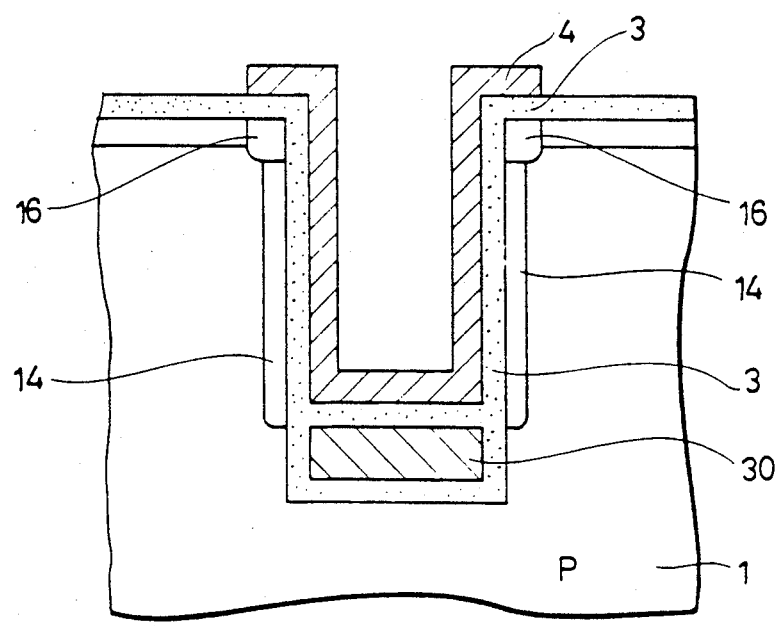
FIG. 9 is a cross sectional view showing a fourth embodiment.

FIG. 9 is a cross sectional view showing a fourth embodiment in which only the structure for isolating elements on the bottom portion of the trench is different, as in FIG. 8. In the fourth embodiment, a polysilicon layer 30 which is in an electrically floating state is formed in the bottom portion of the trench 2. The formation of channel between the n⁻impurity regions 14, 14 can be prevented by this layer, so that the impurity regions are insulated and isolated from each other.

Figure 10:
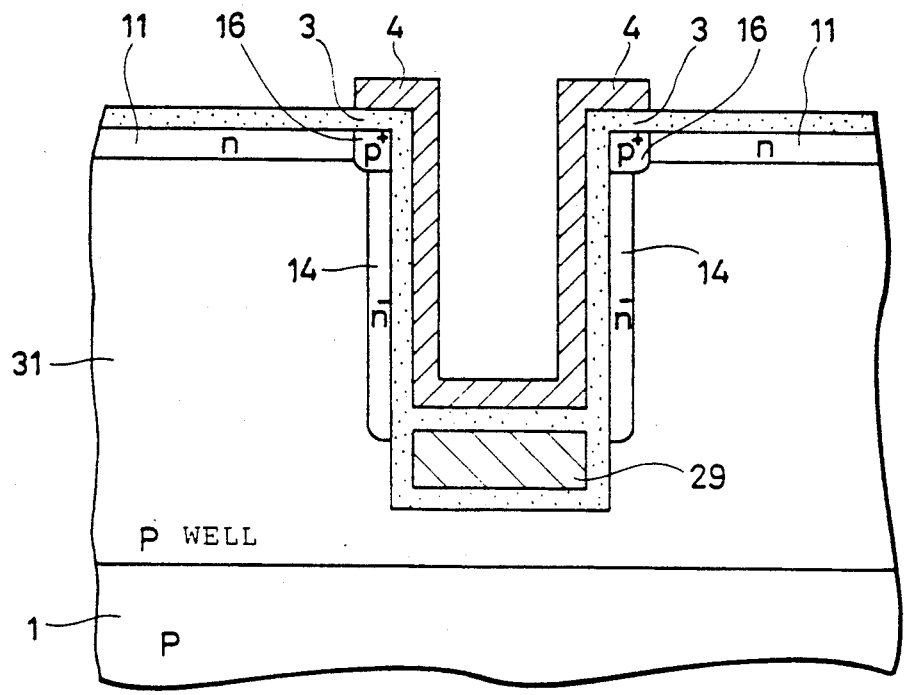
FIG. 10 is a cross sectional view of the solid state sensing device showing a fifth embodiment.

FIG. 10 is a cross sectional view showing a fifth embodiment of the solid state image sensing device shown in FIG. 4. In the fifth embodiment, a p well region 38 which is a p⁺impurity region having higher concentration is formed in the p type silicon substrate 1, and the CCD is formed in the p well region 31. The p well region 31 has the same function as the potential barrier 22 in the structure of FIG. 4. Namely, if the pn junction region of the photosensitive region 8 is flooded by the stored photoelectric charges, the p well region 31 prevents the photoelectric charges from directly entering the n⁻ impurity regions 14 of the CCD. The structure having the p well region can be incorporated with the element isolating structures shown in FIGS. 6, 8 and 9.

Figure 11A:
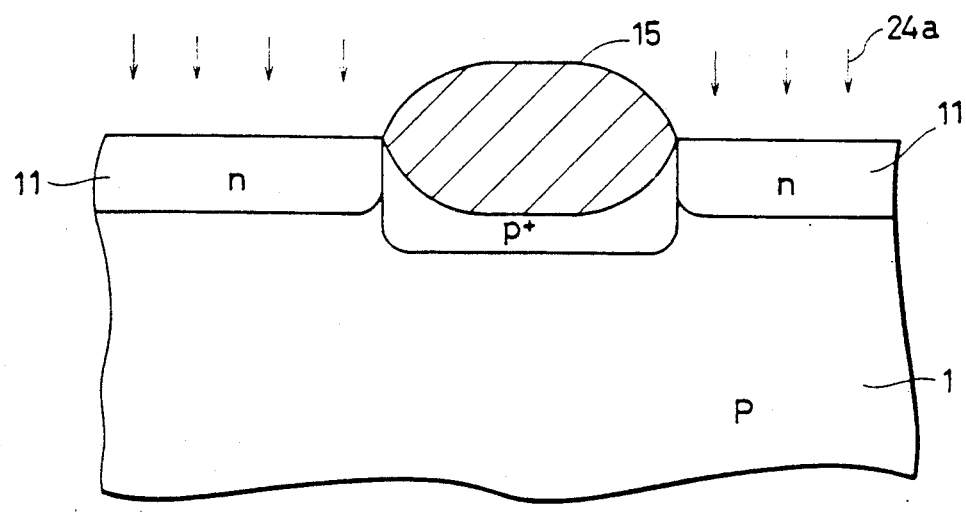
FIGS. 11A, 11b, 11C, 11D, 11E and 11F are cross sectional views showing another method of manufacturing the solid state image sensing device shown in FIG. 4.

Another aspect of the present invention will be hereinafter described with reference to FIGS. 11A to 11F, which is a manufacturing method different from that described with reference to FIGS. 7A to 7D in association with the structure of the solid state image sensing device shown in FIG. 4. First, as shown in FIG. 11A, a channel stopper 32 which is a p type impurity region having higher concentration than the substrate is formed on a prescribed region of a surface of the p type silicon substrate 1. An oxide film 15 for isolating elements is formed on the channel stopper 32 by the LOCOS method. Thereafter, n type impurities 24a are ion implanted to the surface of the p type silicon substrate 1 to form n type impurity regions 11 of the photosensitive regions 8.

Figure 11B:
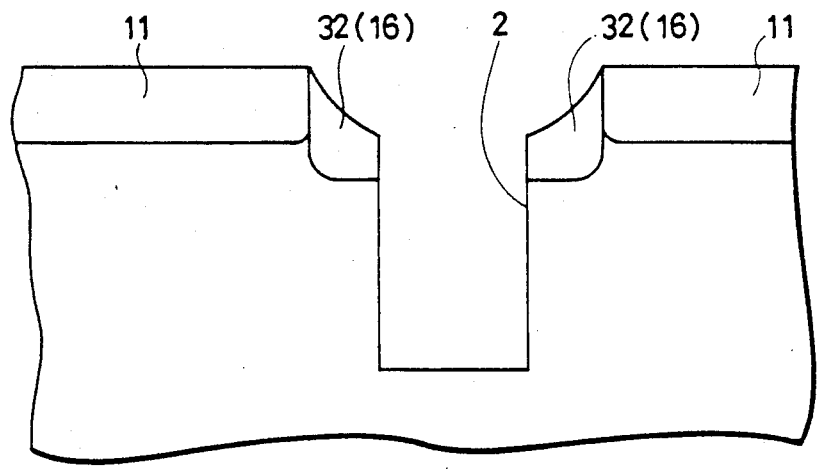

Thereafter, as shown in FIG. 11B, only a portion of the oxide film 15 for isolation which is formed on a region on the surface of the p type silicon substrate 1 on which the trench is to be formed is selectively removed by etching. Thereafter, a trench 2 is formed by etching at a position from which the oxide film 15 for isolation is removed. At this time, the channel stoppers 32 are left on the upper portion of the trench 2, which channel stoppers constitute the surface channel stop layers 16 of the CCD.

Figure 11C:
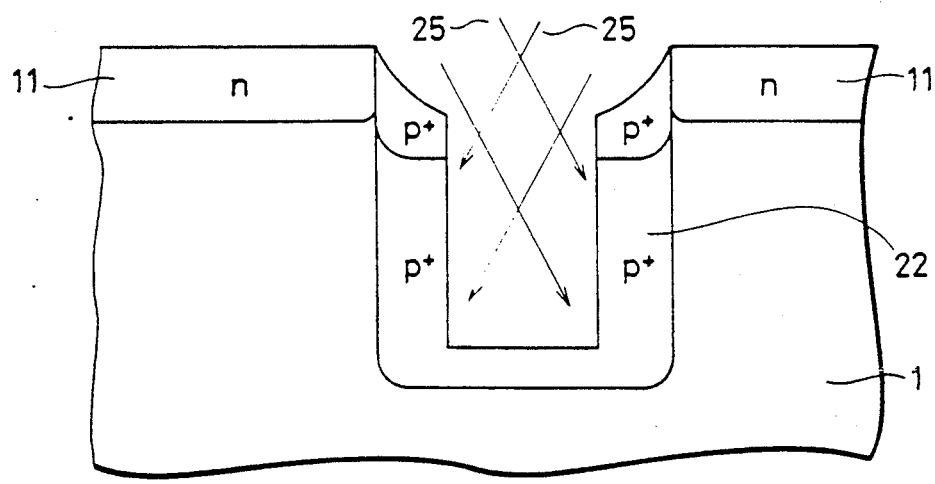

Thereafter, as shown in FIG. 11C, p type impurity ions 25 are implanted by oblique ion implantation to both side surfaces of the trench 2, thereby forming a potential barrier 22 of $p^{30}$ impurity region having higher concentration.

Figure 11D:
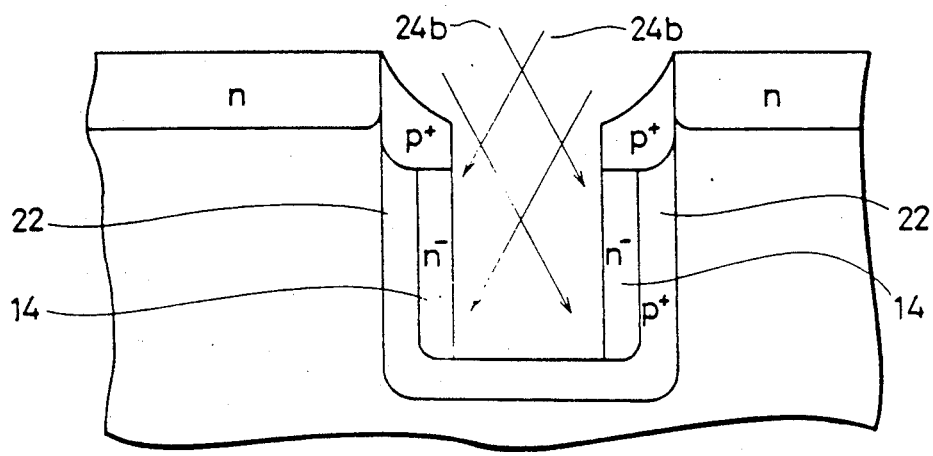

Thereafter, as shown in FIG. 11D, n type impurity ions 24 are implanted by oblique ion implantation on both side surfaces of the trench 2 to form n⁻impurity regions 14, 14 which will be the n channels.

Figure 11E:
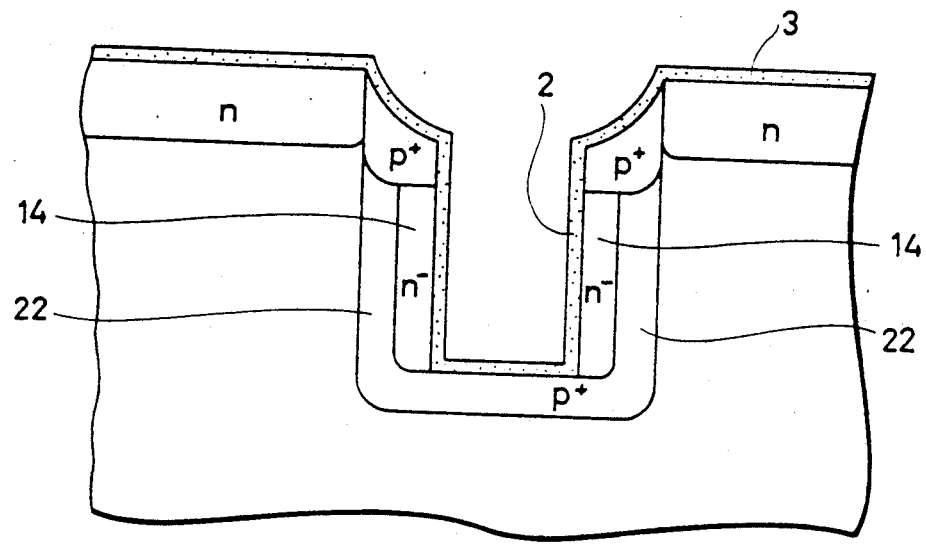

Thereafter, as shown in FIG. 11E, an insulating film 3 is formed on the surface of the p type silicon substrate and on the inner surface of the trench 2.

Figure 11F:
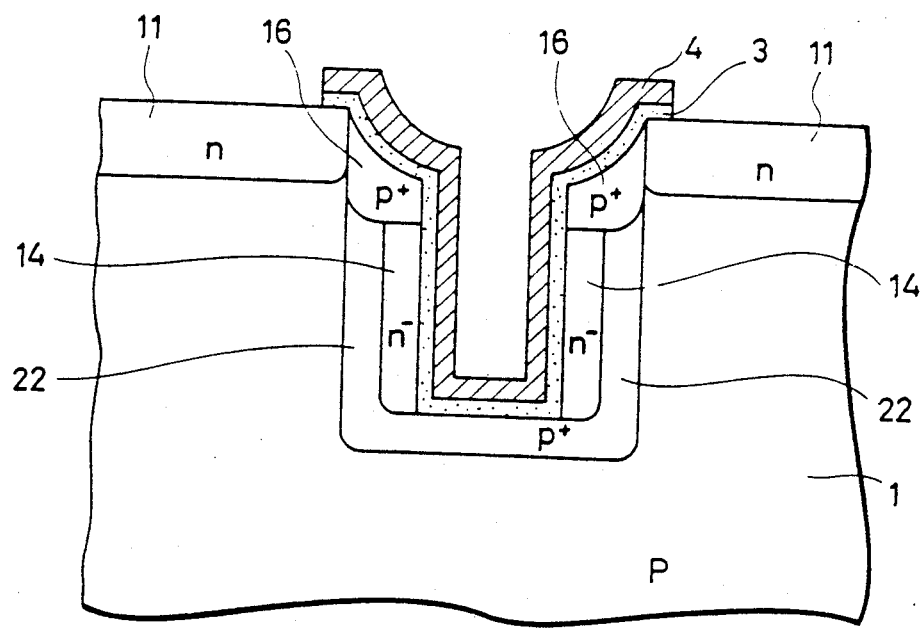
Figure 12:
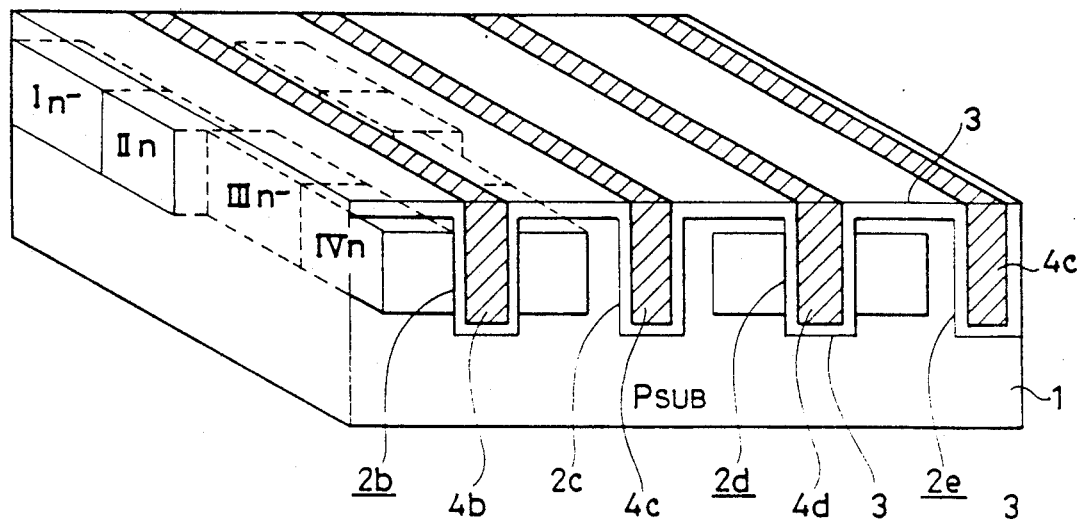
FIG. 12 is a perspective cross sectional view showing a cross sectional structure of a conventional charge transfer device.
Figure 13:
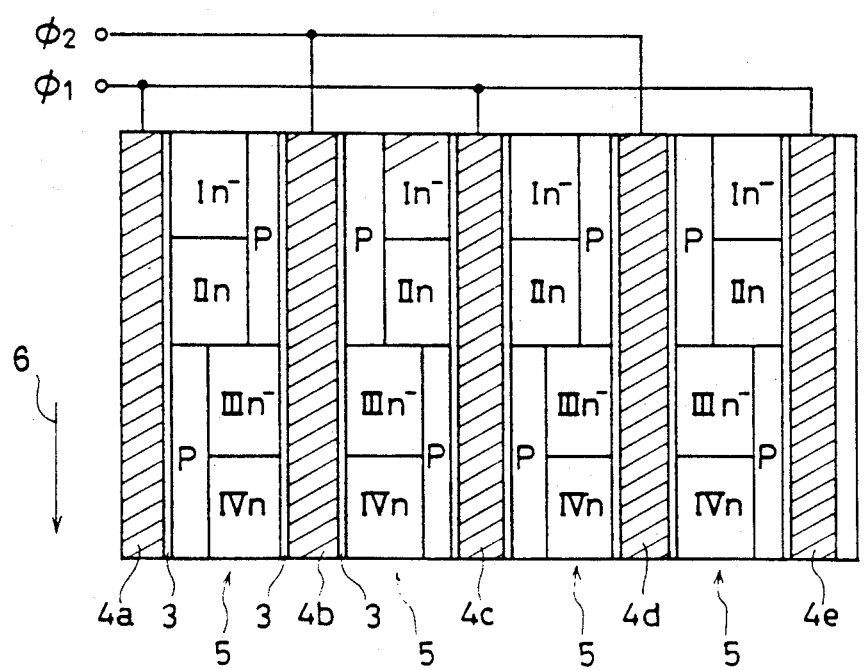
FIG. 13 is a plan view showing a horizontal structure of the charge transfer device shown in FIG. 12.

Thereafter, the same manufacturing steps as shown in FIGS. 7E to 7H are carried out to provide the solid state image sensing device shown in FIG. 11F.

In the manufacturing method of the present embodiment, the surface channel stop layer 16 of the CCD is formed in the same step for forming the element isolating structure for isolating the photosensitive region 8 by using the channel stopper 32 formed below the oxide film 15 for isolation. By doing so, the surface channel stop layers 16 can be easily provided.

Various modifications of the solid state image sensing device shown in FIG. 4 have been proposed as described with reference to the second to sixth embodiments. More specifically, the structure of FIG. 4 is a basic structure. A first group of embodiments is in association with the structure for isolating elements formed on the bottom portion of the trench 2. The structure for isolating the electrodes 4 shown in FIG. 6, the isolating structure employing the SOG layer 29 shown in FIG. 8 and the isolating structure employing the polysilicon layer 30 shown in FIG. 9 are included in this group. A second group of the modifications is in association with the structure for preventing leak of signal charges from the photosensitive regions 8 to the n channel regions 14, 14. The potential barrier structure 22 shown in FIG. 4 and the structure of the p well regions 31 shown in FIG. 10 are included in this group. A third group of modifications is in association with the manufacturing method. The method for forming the trench 2 and n channel regions 14, 14 shown in FIGS. 7A to 7D and the similar manufacturing steps shown in FIGS. 11A to 11F are included in this group. The first, second and third groups of modifications may be arbitrarily combined with each other.

The insulating and isolating means formed on the bottom portion of the trench 2 can be also applied to the CCD shown in FIG. 1.

As described above, in the charge coupled device in accordance with the present invention, independent charge transfer devices are formed on both side surfaces of a trench formed on the surface of the semiconductor substrate, which devices are insulated and isolated from each other at the bottom portions of the trench, whereby the occupied area of the surface of the semiconductor substrate can be reduced, and the degree of integration of the device can be increased. In addition, in the solid state image sensing device employing such charge coupled devices, the vertical charge transferring regions can be arranged on every other lines of photosensitive regions, whereby the surface area occupied by the charge transfer regions can be reduced, the opening ratio can be improved, and the sensitivity of the solid state image sensing device can be improved.

In addition, in accordance with the manufacturing method of the present invention, charge transfer regions can be easily formed on sidewalls of a minute trench, which regions are independent from each other as they are insulated and isolated from each other at the bottom portion of the trench.

The foregoing and other objects, features, aspects and advantages of the present invention will become more apparent from the following detailed description of the present invention when taken in conjunction with the accompanying drawings.

What is claimed is:

1. A charge coupled device for transferring charges in a prescribed direction by applying a voltage to a region storing charges, comprising:
    a semiconductor substrate of a first conductivity type having a main surface and a trench formed on the main surface extending in said charge transferring direction having opposing side surfaces spaced from each other and a bottom surface coupling the opposing side surfaces;
    impurity regions of a second conductivity type formed independent from each other on each of both side surfaces of said trench;
    a plurality of first transferring electrodes, with an insulating film interposed therebetween, formed on a surface of said impurity region formed on one side surface of said trench said electrodes arranged in said charge transferring direction for transferring charges stored in said impurity region to a prescribed direction;
    a plurality of second transferring electrodes, with an insulating film interposed therebetween, formed on a surface of said impurity region formed on the other side surface of said trench said electrodes arranged in said charge transferring direction, for transferring charges stored in said impurity region to a prescribed direction; and
    means formed on a bottom portion of said trench for electrically insulating and isolating the impurity regions formed on both side surfaces of said trench from each other.

2. A charge coupled device according to claim 1, further comprising:
    an impurity region of the first conductivity type having higher concentration than said semiconductor substrate formed between the main surface of said semiconductor substrate and each impurity region of said second conductivity type.

3. A charge coupled device according to claim 1, wherein
    one of plurality of said first electrodes and one of plurality of said second electrodes are connected to each other at the bottom portion of the trench.

4. A charge coupled device according to claim 3, wherein
    said isolating and insulating means comprises an insulating film for isolation formed on the bottom portion of said trench.

5. A charge coupled device according to claim 3, wherein
    said isolating and insulating means comprises a spin-on-glass film formed on the bottom portion of said trench.

6. A charge coupled device according to claim 3, wherein
    said isolating and insulating means comprises a polysilicon layer formed on the bottom portion of said trench.

7. A charge coupled device according to claim 1, wherein
    said first transfer electrodes and said second transfer electrodes are isolated from each other at the bottom portion of said trench, the structure of isolating the electrodes constituting said isolating and insulating means.

8. A charge coupled device according to claim 1, wherein
    each of said plurality of first transfer electrodes and the second transfer electrodes (4a, 4b) arranged in the prescribed directions has an end portion being overlapped with an end portion of another one of the electrodes.

9. A solid state image sensing device converting incidental light to signal charges to output the same to a prescribed position, comprising:
    a semiconductor substrate having a main surface and a plurality of trenches formed parallel to each other on the main surface, each of the trenches having opposing side surfaces spaced from each other and a bottom surface coupling both side surfaces;
    a plurality of lines of first photoelectric converting elements positioned on portions of the main surface of said semiconductor substrate adjacent to one side surface of each of said trenches, arranged along said trenches for generating signal charges corresponding to the incidental light;
    a plurality of lines of second photoelectric converting elements positioned on portions of the main surface of said semiconductor substrate adjacent to the other side surface of each of said trenches arranged along said trenches for generating signal charges corresponding to the incidental light;
    a plurality of transfer gates for taking out signal charges generated in the photoelectric converting elements constituting said lines of first and second photoelectric converting elements;
    first charge coupled devices formed on one side portion of each of said trenches including a plurality of transfer electrodes for transferring said signal charges taken out from the photoelectric converting elements of said lines of first photoelectric converting elements by the operation of said transfer gates to a prescribed position;
    second charge coupled devices formed on the other side portion of each of said trenches including a plurality of transfer electrodes for transferring said signal charges taken out from the photoelectric converting elements of said lines of second photoelectric converting elements by the operation of said transfer gates to a prescribed position; and
    means formed on the bottom portion of each of said trenches for electrically insulating and isolating the first charge coupled devices formed on one side portion of each of said trenches from said second charge coupled devices on the other side portion of each of said trenches.

10. A solid state image sensing device according to claim 9, wherein
said isolating and insulating means comprises an insulating film for isolation formed on the bottom portion of said trench.

11. A solid state image sensing device according to claim 9, wherein
said isolating and insulating means comprises a spin-in-glass film formed on the bottom portion of said trench.

12. A solid state image sensing device according to claim 9, wherein
said isolating and insulating means comprises a polysilicon layer formed on the bottom portion of said trench.

13. A solid state image sensing device according to claim 9, wherein
the transfer electrodes of said first charge coupled devices are isolated from the transfer electrodes of said second charge coupled devices at the bottom portions of said trench, the structure of the electrode isolation constituting said isolating and insulating means.

14. A solid state image sensing device according to claim 9, wherein
each of said charge coupled devices comprises:
an impurity region of the second conductivity type formed on a side surface of said trench, and
an impurity region of the first conductivity type having higher concentration than said semiconductor substrate formed surrounding said impurity region.

15. A solid state image sensing device according to claim 9, wherein
said semiconductor substrate comprises a well region of the first conductivity type having higher concentration than said semiconductor substrate formed on the main surface,
wherein said photoelectric converting elements, said transfer gates and said charge coupled devices are formed on said well region 16. A solid state image sensing device according to claim 9, wherein adjacent ones of said plurality of transfer electrodes of said first CCD arranged in the direction of charge transfer have end portions thereof overlapping with each other, and
adjacent ones of said plurality of transfer electrodes of said second CCD arranged in the direction of charge transfer have end portions thereof overlapping with each other.

17. A charge coupled device for transferring charges in a prescribed direction by applying a voltage to a region storing charges, comprising:
a semiconductor substrate of a first conductivity type having a main surface and a trench formed on the main surface extending in said charge transferring direction having opposing side surfaces spaced from each other and a bottom surface coupling the opposing side surfaces;
impurity regions of a second conductivity type formed independent from each other on each of the side surfaces of said trench;
a plurality transferring electrodes formed on a surface of said trench, with an insulating film interposed therebetween, said electrodes arranged in said charge transferring direction for transferring charges stored in said impurity regions in a prescribed direction; and
means formed on the bottom surface of said trench for electrically insulating and isolating the impurity regions formed on both side surfaces of said trench from each other.

18. A solid state image sensing device converting incidental light to signal charges to output the same to a prescribed position, comprising:
a semiconductor substrate having a main surface and a trench formed on the main surface, the trench having opposing side surfaces paced from each other and a bottom surface coupling both side surfaces;
a line of first photoelectric converting elements positioned on portions of the main surface of said semiconductor substrate adjacent to one side surface of said trench and arranged along said trench for generating signal charges corresponding to the incidental light;
a line of second photoelectric converting elements positioned on portions of the main surface of said semiconductor substrate adjacent to the other side surface of said trench and arranged along said trench for generating signal charges corresponding to the incidental light;
a plurality of transfer gates for taking out signal charges generated in the photoelectric converting elements constituting said lines of first and second photoelectric converting elements;
a first charge coupled device formed on one side portion of said trench including a plurality of transfer electrodes for transferring said signal charges taken out from the photoelectric converting elements of said line of first photoelectric converting elements by the operation of said transfer gates to a prescribed position;
a second charge coupled device formed on the other side portion of said trench including a plurality of transfer electrodes for transferring said signal charges taken out from the photoelectric converting elements of said line of second photoelectric converting elements by the operation of said transfer gates to a prescribed position; and
means formed on the bottom portion of said trench for electrically insulating and isolating the first charge coupled device formed on one side portion of said trench from said second charge coupled device on the other side portion of said trench.

* * * * *